(12) United States Patent
Hirano et al.

(10) Patent No.: US 6,787,855 B2
(45) Date of Patent: Sep. 7, 2004

(54) SEMICONDUCTOR DEVICE AND METHOD OF MANUFACTURING SAME

(75) Inventors: Yuuichi Hirano, Tokyo (JP);
Shigenobu Maeda, Tokyo (JP); Shigeto Maegawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 09/778,104

(22) Filed: Feb. 7, 2001

(65) Prior Publication Data

US 2002/0017689 A1 Feb. 14, 2002

(30) Foreign Application Priority Data

Aug. 4, 2000 (JP) .................................... P2000-236814

(51) Int. Cl.[7] ..................... H01L 27/12; H01L 31/0392;
H01L 27/01; H01L 21/00; H01L 21/84;
H01L 21/425
(52) U.S. Cl. ..................... 257/351; 257/347; 257/350;
438/149; 438/153; 438/154; 438/479; 438/517
(58) Field of Search ................................ 257/351, 347,
257/350, 366, 401, 444, 331; 438/149,
153, 154, 479, 517

(56) References Cited

U.S. PATENT DOCUMENTS

| | | | | |
|---|---|---|---|---|
| 4,938,567 A | * | 7/1990 | Chartier | 359/245 |
| 5,266,825 A | * | 11/1993 | Tsukada et al. | 257/366 |
| 5,789,790 A | * | 8/1998 | Morishita et al. | 257/378 |
| 6,140,687 A | * | 10/2000 | Shimomura et al. | 257/401 |

FOREIGN PATENT DOCUMENTS

| | | |
|---|---|---|
| JP | 3-156929 | 7/1991 |
| JP | 8-130304 | 5/1996 |

OTHER PUBLICATIONS

K. Imai, et al.; "A 0.13–$\mu$m CMOS Technology Integrating High–Speed and Low–Power/High–Density Devices with Two Different Well/Channel Structures"; IEEE IEDM, 1999, pp.667–670.
Don Monroe, Jack Hergenrother, The Vertical Replacement Gate (VRG) Process for Scalable General–purpose Complementary Logic, Bell Labs, Lucent Technologies, Murray Hill, NJ.

* cited by examiner

*Primary Examiner*—Nathan J. Flynn
*Assistant Examiner*—Victor A. Mandala, Jr.
(74) *Attorney, Agent, or Firm*—Oblon, Spivak, McClelland, Maier & Neustadt, P.C.

(57) ABSTRACT

A semiconductor device and a manufacturing method thereof are obtained which can restrain increase of the parasitic capacitance generated between contact plugs of source/drain regions and a gate electrode while reducing the area of the source/drain regions. A channel region is formed under a gate electrode 1. A pair of source/drain regions 2 are formed to sandwich the channel region. The source/drain regions 2 have a first part 3a being adjacent to the channel region and a second part 3b formed to protrude in a channel width direction from the first part 3a so that a part of outer peripheries of the source/drain regions 2 extend away from the gate electrode 1 in a plan view. Contact plugs 4 are formed on the second part 3b for connecting the source/drain regions 2 to source/drain wirings.

11 Claims, 22 Drawing Sheets

F I G . 1
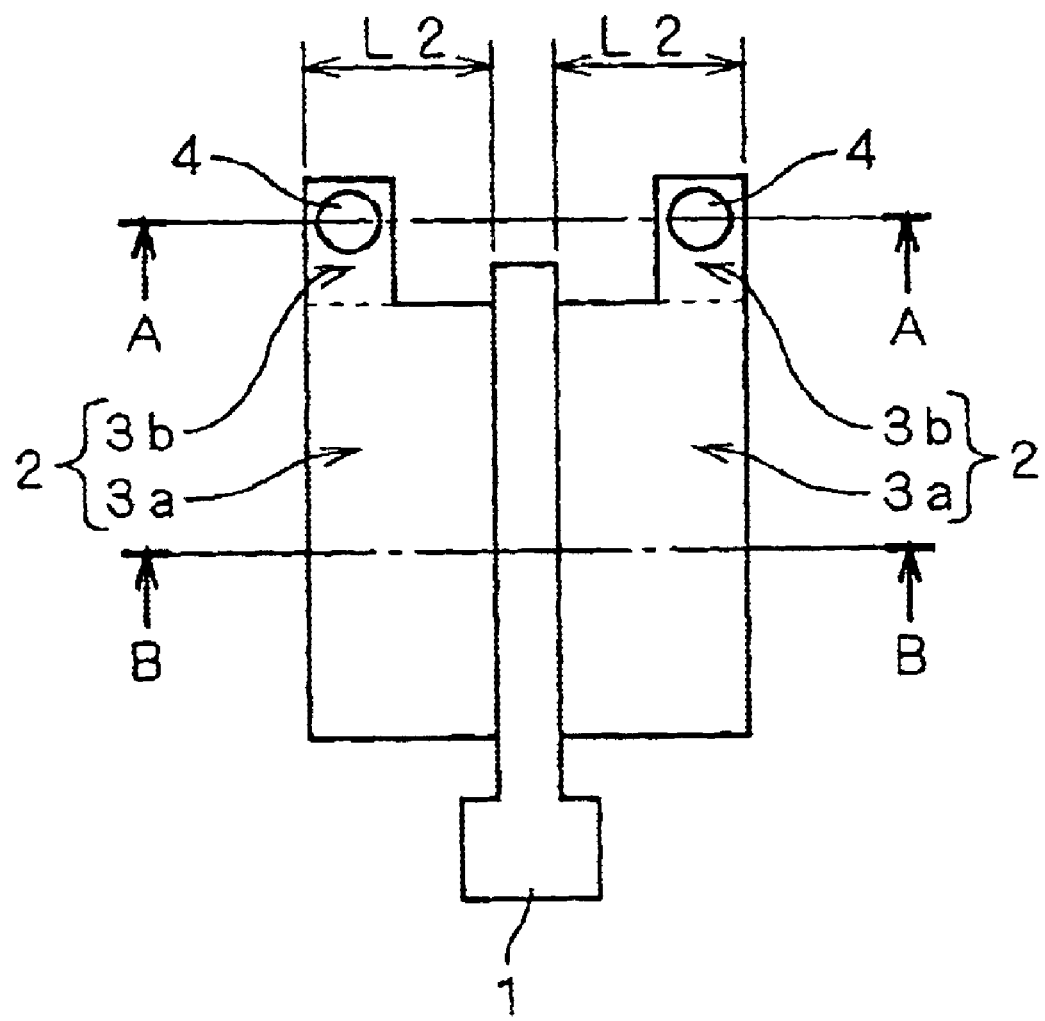

F I G . 2A
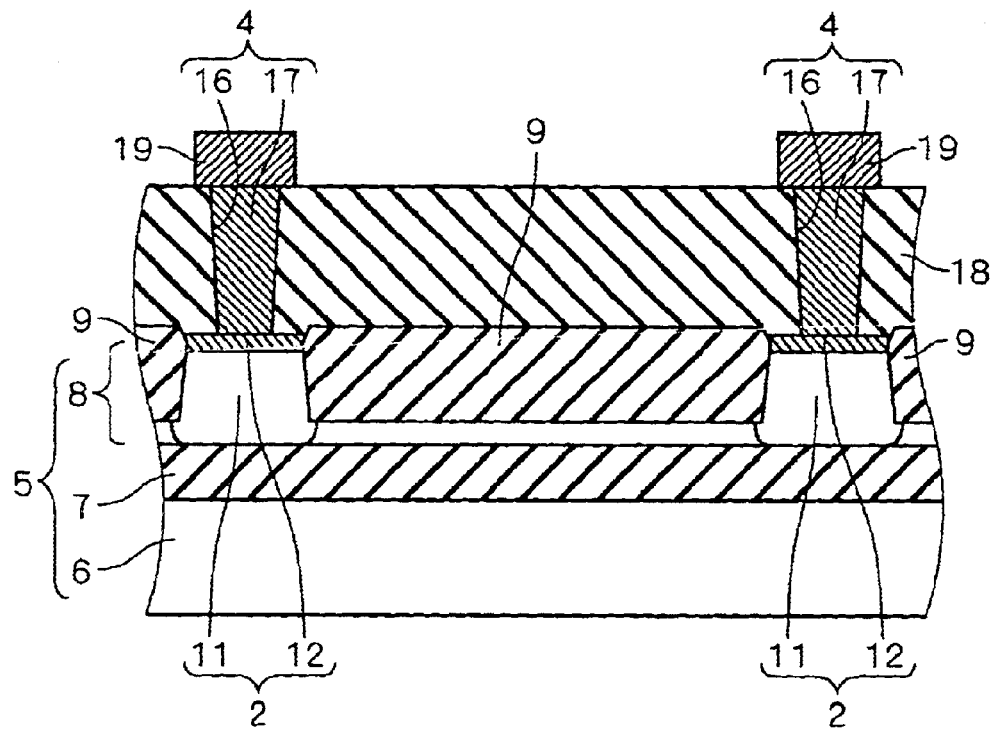
F I G . 2B
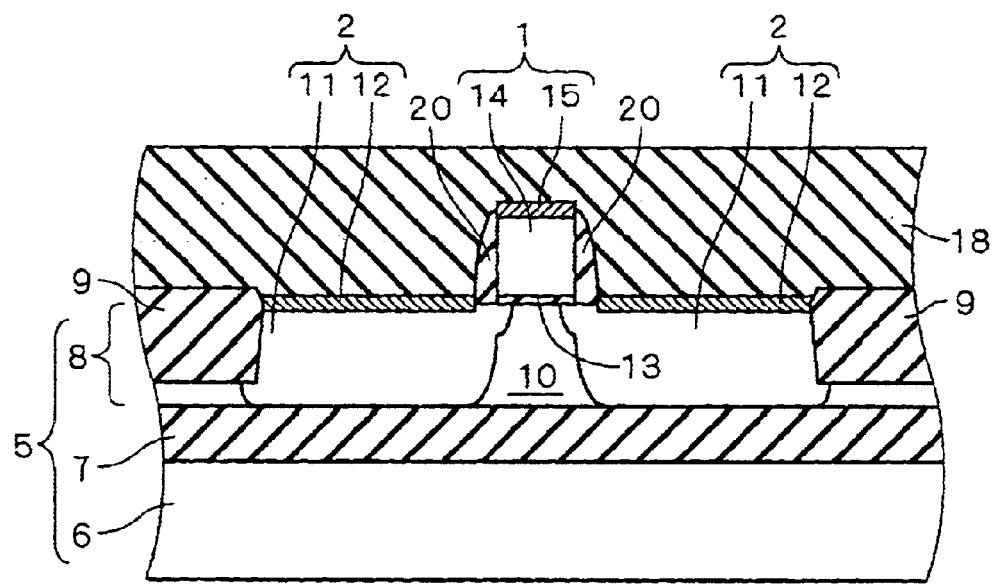

F I G . 9A
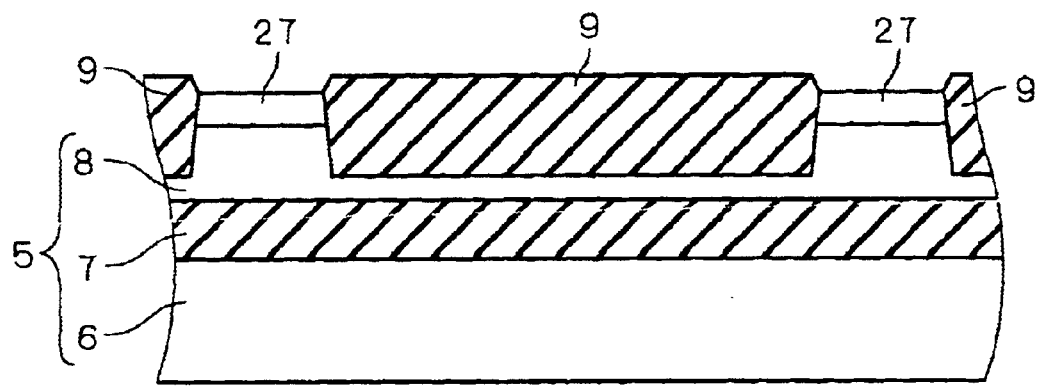
F I G . 9B
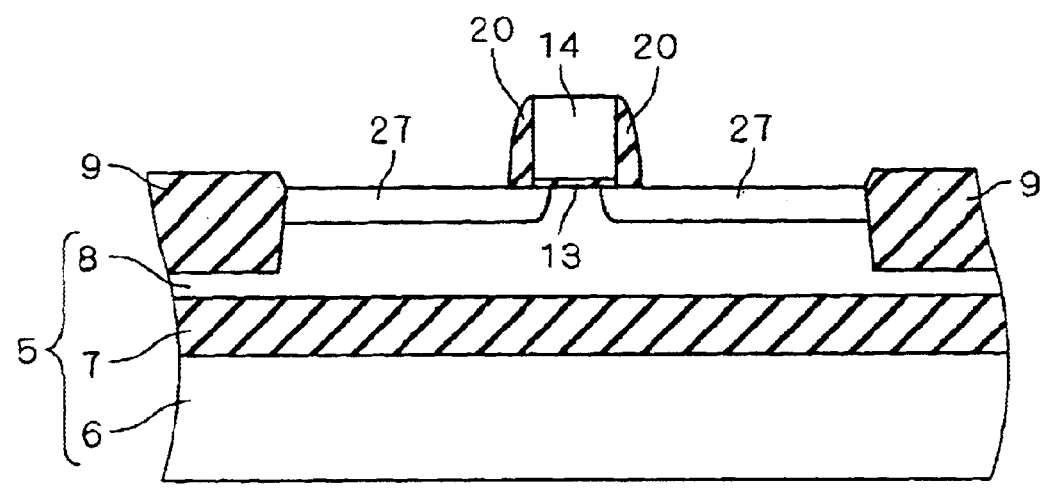

F I G . 10A
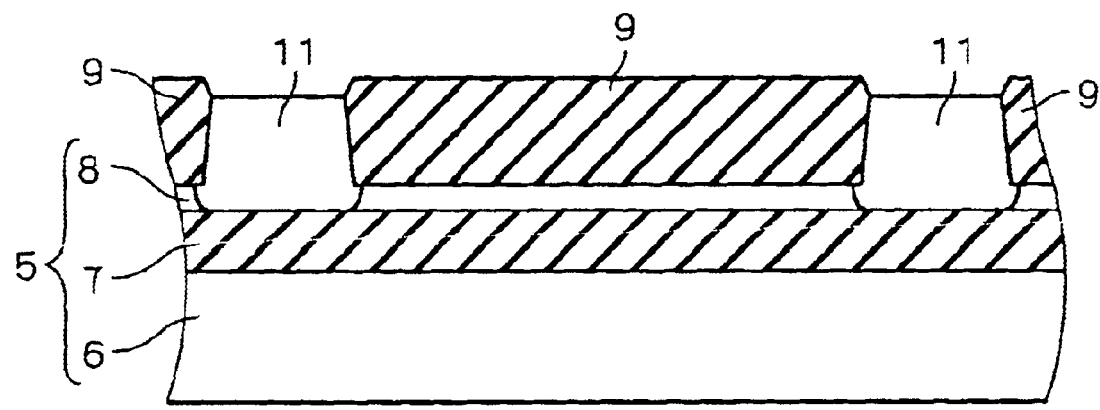
F I G . 10B
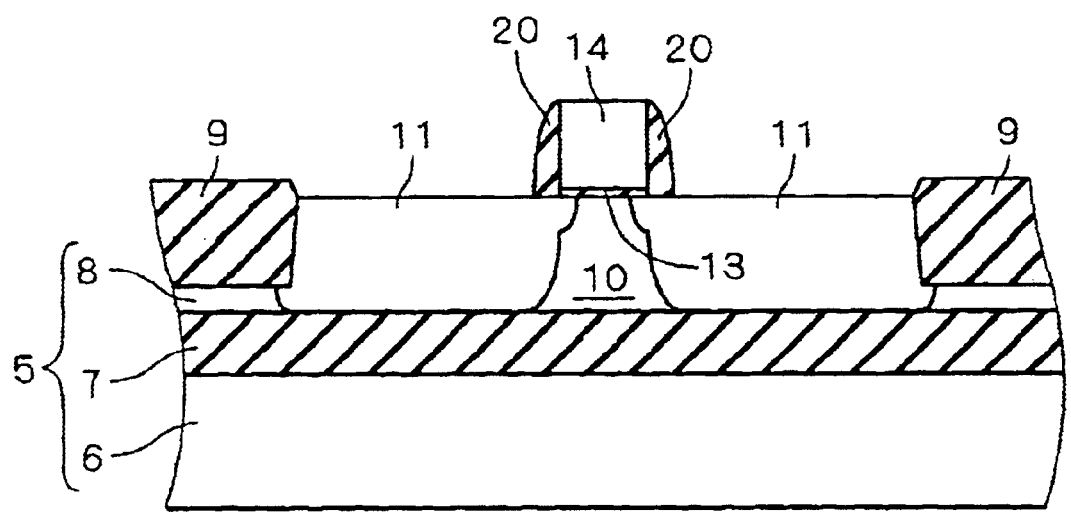

F I G . 11A
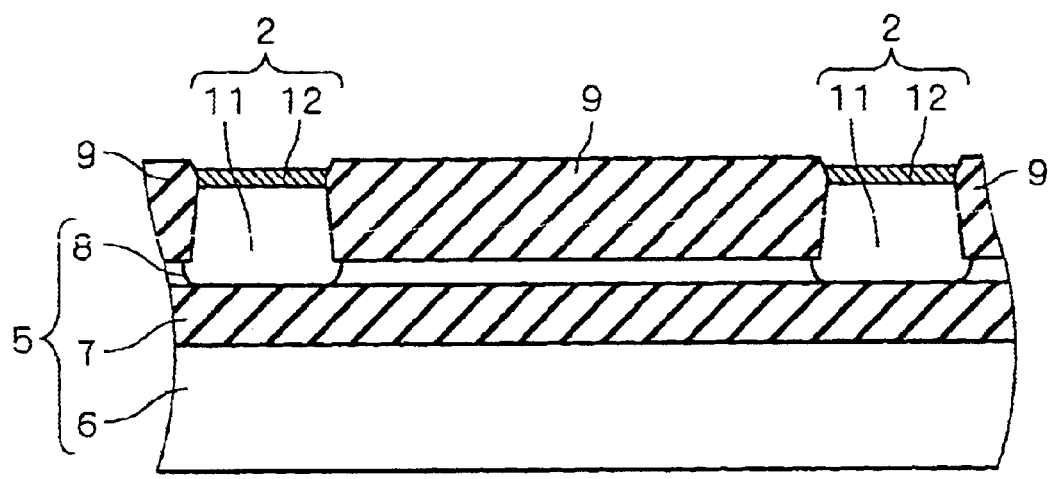
F I G . 11B
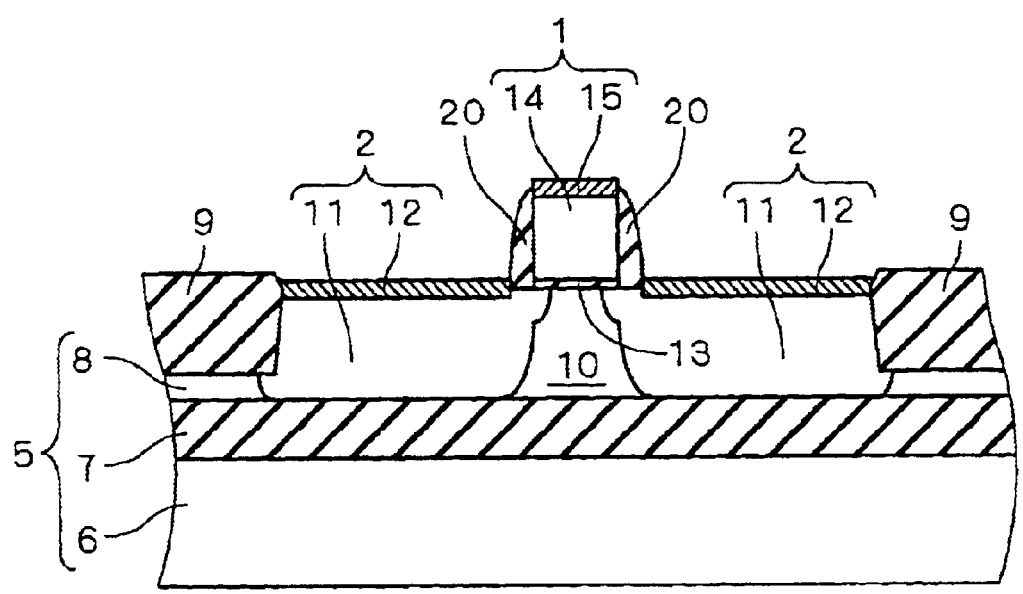

SEMICONDUCTOR DEVICE AND METHOD OF MANUFACTURING SAME

BACKGROUND OF THE INVENTION

1. Field of the Invention

The present invention relates to a structure of semiconductor device and a method of manufacturing the same, and more particularly to a structure of a MOSFET that can reduce the scale of elements, increase the operation speed, and reduce the electric power consumption, and a method of manufacturing the same.

2. Description of the Background Art

FIG. 27 is a top view illustrating a structure of a general MOSFET. A channel region (not appearing in FIG. 27) is formed under a gate electrode 101, and a pair of source/drain regions 102 are formed to sandwich the channel region. Further, contact plugs 103 for connecting the source/drain regions 102 to source/drain wirings (not illustrated) are formed.

In such a MOSFET, the area of the source/drain regions 102 tend to be reduced in order to reduce the scale of elements. FIG. 28 is a top view illustrating a structure of a conventional MOSFET with reduced area of the source/drain regions. Source/drain regions 104 are formed instead of the source/drain regions 102 shown in FIG. 27. While the width of the source/drain regions in the channel length direction is L102 in the MOSFET shown in FIG. 27, the width is L104 (<L102) in the MOSFET shown in FIG. 28, whereby the reduction of the area of the source/drain regions is achieved.

FIG. 29 is a cross-sectional view illustrating a cross section structure with respect to the position along the line X100 shown in FIG. 28. An SOI substrate 105 has a multilayered structure in which a silicon substrate 106, a BOX (buried oxide) layer 107, and a silicon layer 108 are layered in this order. An element isolation dielectric film 109 such as STI (shallow trench isolation) is selectively formed in a top surface of the silicon layer 108.

In an element formation region of the SOI substrate 105 defined by the element isolation dielectric film 109, source/drain regions 104 forming a pair to sandwich a p-type body region 110 (corresponding to the aforesaid channel region) are formed in the top surface of the silicon layer 108. The source/drain regions 104 have an $n^+$-type impurity diffusion region 111 formed from the top surface of the silicon layer 108 to reach the top surface of the BOX layer 107, and a silicide layer 112 formed by turning the top surface of the silicon layer 108 into silicide.

On the body region 110, a gate structure is formed having a multilayered structure in which a gate oxide film 113 and a gate electrode 101 are layered in this order. A side wall 120 made of silicon oxide is formed on the side surface of the gate structure. The gate electrode 101 has a polysilicon layer 114 formed on the gate oxide film 113 and a silicide layer 115 formed on the polysilicon layer 114.

Further, an interlayer dielectric film 118 made of silicon oxide is formed to cover the respective exposed surfaces of the silicide layers 115, 112, the side wall 120, and the element isolation dielectric film 109. Source/drain wirings 119 made of aluminum or the like are formed on the interlayer dielectric film 118. Further, contact plugs 103 for connecting the source/drain wirings 119 to the source/drain regions 104 are selectively formed in the interlayer dielectric film 118. The contact plugs 103 each have a contact hole 116 formed from the top surface of the interlayer dielectric film 118 to reach the top surface of the silicide layer 112, and a conductor plug 117 that fills the inside of the contact hole 116.

According to such a conventional MOSFET, scale reduction of elements can be achieved by reducing the area of the source/drain regions 104. Further, in a MOSFET using an ordinary bulk substrate instead of an SOI substrate, by reducing the area of the source/drain regions, the junction area between the source/drain regions and the silicon substrate having different conductivity types from each other is reduced, thereby leading to reduction of the source/drain capacitance.

However, in accordance with the reduction of the area of the source/drain regions 104, the distance between the contact plugs 103 and the gate electrode 101 becomes smaller, so that parasitic capacitance 121 generated between the two increases, thereby raising a problem.

SUMMARY OF THE INVENTION

A semiconductor device according to the first aspect of the present invention includes: an SOI substrate having a semiconductor substrate, a dielectric layer, and a semiconductor layer formed in this order; a transistor having a drain region and a source region respectively formed in the semiconductor layer, and a gate electrode formed via a gate dielectric film on a channel region sandwiched between the drain region and the source region; an interlayer dielectric film formed on the transistor; a drain wiring and a source wiring formed on the interlayer dielectric film; a first conductor formed in the interlayer dielectric film for connecting the drain wiring to the drain region; and a second conductor formed in the interlayer dielectric film for connecting the source wiring to the source region, wherein the drain region has a first part being adjacent to the channel region and a second part formed to protrude from the first part so that a part of outer peripheries of the drain region extends away from the gate electrode in a plan view, and the first conductor is connected to the second part of the drain region.

According to the first aspect of the present invention, the distance between the first conductor and the gate electrode can be increased as compared with a semiconductor device in which the first conductor is connected to the first part of the drain region. Therefore, the parasitic capacitance generated between the first conductor and the gate electrode can be reduced.

Moreover, since the SOI substrate is adopted, the drain region can be formed from the top surface of the semiconductor layer to reach the top surface of the dielectric layer. Therefore, although the area of the drain region increases by the area of the formed second part, the increase of the drain capacitance accompanying the increase of the area can be restrained to the minimum.

A semiconductor device according to the second aspect of the present invention is the semiconductor device according to the first aspect, wherein the first part of the drain region has a width of 0.2 to 0.5 μm with respect to a channel length direction of the channel region, and the second part of the drain region has a length of 0.1 to 0.5 μm with respect to a direction protruding from the first part of the drain region.

A semiconductor device according to the third aspect of the present invention is the semiconductor device according to the first aspect, wherein the first part of the drain region has a plurality of corner parts in a plan view, and the second part of the drain region is formed to protrude obliquely with respect to a channel width direction of the channel region from the corner part which is not adjacent to the gate electrode.

According to the third aspect of the present invention, the distance between the first conductor and the gate electrode can be increased as compared with a semiconductor device in which the second part of the drain region is formed to protrude in the channel width direction. Therefore, the parasitic capacitance generated between the two can be reduced.

A semiconductor device according to the fourth aspect of the present invention is the semiconductor device according to the first aspect, wherein a bottom surface of the first conductor is partially in contact with the second part of the drain region by being shifted away from the gate electrode.

According to the fourth aspect of the present invention, the distance between the first conductor and the gate electrode can be further increased. Therefore, the parasitic capacitance generated between the two can be further reduced.

A semiconductor device according to the fifth aspect of the present invention is the semiconductor device according to the first aspect, wherein the source region has a first part being adjacent to the channel region and a second part formed to protrude from the first part so that a part of outer peripheries of the source region extends away from the gate electrode in a plan view, and the second conductor is connected to the second part of the source region.

According to the fifth aspect of the present invention, the distance between the second conductor and the gate electrode can be increased as compared with a semiconductor device in which the second conductor is connected to the first part of the source region. Therefore, the parasitic capacitance generated between the second conductor and the gate electrode can be reduced.

A semiconductor device according to the sixth aspect of the present invention is the semiconductor device according to the fifth aspect, wherein the first part of the source region has a width of 0.2 to 0.5 $\mu$m with respect to a channel length direction of the channel region, and the second part of the source region has a length of 0.1 to 0.5 $\mu$m with respect to a direction protruding from the first part of the source region.

A semiconductor device according to the seventh aspect of the present invention is the semiconductor device according to the fifth aspect, wherein the first part of the source region has a plurality of corner parts in a plan view, and the second part of the source region is formed to protrude obliquely with respect to a channel width direction of the channel region from the corner part which is not adjacent to the gate electrode.

According to the seventh aspect of the present invention, the distance between the second conductor and the gate electrode can be increased as compared with a semiconductor device in which the second part of the source region is formed to protrude in the channel width direction. Therefore, the parasitic capacitance generated between the two can be reduced.

A semiconductor device according to the eighth aspect of the present invention is the semiconductor device according to the fifth aspect, wherein a bottom surface of the second conductor is partially in contact with the second part of the source region by being shifted away from the gate electrode.

According to the eighth aspect of the present invention, the distance between the second conductor and the gate electrode can be further increased. Therefore, the parasitic capacitance generated between the two can be further reduced.

A semiconductor device according to the ninth aspect of the present invention is the semiconductor device according to the first aspect, wherein the source region has a first part being adjacent to the channel region, and the second conductor is connected to the first part of the source region.

According to the ninth aspect of the present invention, the distance between the second conductor and the gate electrode can be decreased as compared with a semiconductor device according to any one of the fifth to eighth aspects of the present invention. Therefore, rise of the source resistance caused by disposal of the second conductor away from the gate electrode can be avoided, thereby preventing generation of the substrate bias effect accompanying the rise of the source resistance.

A semiconductor device according to the tenth aspect of the present invention is the semiconductor device according to the first aspect, wherein the transistor further has a side wall formed on a side surface of the gate electrode, and the side wall is constructed with a porous material.

According to the tenth aspect of the present invention, the dielectric constant of the side wall can be reduced by forming the side wall with a porous material. Therefore, the parasitic capacitance generated between the first and second conductors and the gate electrode can be reduced as compared with a semiconductor device having a side wall made of a non-porous material.

A semiconductor device according to the eleventh aspect of the present invention is the semiconductor device according to the first aspect, wherein the interlayer dielectric film is formed except for a region between the gate electrode and the first and second conductors.

According to the eleventh aspect of the present invention, the dielectric constant of the region between the gate electrode and the first and second conductors is reduced. Therefore, the parasitic capacitance generated between the two can be reduced.

A semiconductor device according to the twelfth aspect of the present invention includes: a substrate; a transistor having a pair of source/drain regions formed in the substrate, a gate electrode formed via a gate dielectric film on a channel region sandwiched between the pair of source/drain regions, and a side wall formed on a side surface of the gate electrode; an interlayer dielectric film formed on the transistor; source/drain wirings formed on the interlayer dielectric film; and conductors formed in the interlayer dielectric film for connecting the source/drain wirings to the source/drain regions, wherein the side wall is constructed with a porous material.

According to the twelfth aspect of the present invention, the dielectric constant of the side wall can be reduced by forming the side wall with a porous material. Therefore, the parasitic capacitance generated between the conductors and the gate electrode can be reduced as compared with a semiconductor device having a side wall made of a non-porous material.

A semiconductor device according to the thirteenth aspect of the present invention includes: a substrate; a transistor having a pair of source/drain regions formed in the substrate, and a gate electrode formed via a gate dielectric film on a channel region sandwiched between the pair of source/drain regions; an interlayer dielectric film formed on the transistor; source/drain wirings formed on the interlayer dielectric film; and conductors formed in the interlayer dielectric film for connecting the source/drain wirings to the source/drain regions, wherein the interlayer dielectric film is formed except for a region between the gate electrode and the conductors.

According to the thirteenth aspect of the present invention, the dielectric constant of the region between the gate electrode and the conductors is reduced. Therefore, the parasitic capacitance generated between the two can be reduced.

A method of manufacturing a semiconductor device according to the fourteenth aspect of the present invention includes the steps of: (a) preparing a substrate; (b) forming a gate structure made of a multilayered structure having a gate dielectric film and a gate electrode formed in this order on a main surface of the substrate; (c) forming a side wall on a side surface of the gate structure; (d) forming source/drain regions by introducing an impurity into a part of the substrate where the gate structure and the side wall are not formed; (e) forming an interlayer dielectric film on a structure obtained by the step (d); (f) forming conductors in the interlayer dielectric film, the conductors being connected to the source/drain regions; (g) forming source/drain wirings on the interlayer dielectric film, the source/drain wirings being connected to the conductors; and (h) removing the interlayer dielectric film between the conductors and the gate structure.

According to the fourteenth aspect of the present invention, the dielectric constant of the region between the gate electrode and the conductors is reduced. Therefore, the parasitic capacitance generated between the two can be reduced.

A method of producing a semiconductor device according to the fifteenth aspect of the present invention is the method of producing a semiconductor device according to the fourteenth aspect, wherein the side wall is also removed in the step (h).

According to the fifteenth aspect of the present invention, the dielectric constant of the region between the gate electrode and the conductors is further reduced by removing the side wall. Therefore, the parasitic capacitance generated between the two can be further reduced.

An object of the present invention is to provide a semiconductor device and a manufacturing method thereof in which the increase of the parasitic capacitance generated between the contact plugs of the source/drain regions and the gate electrode can be restrained while reducing the area of the source/drain regions. These and other objects, features, aspects, and advantages of the present invention will become more apparent from the following detailed description of the present invention when taken in conjunction with the accompanying drawings.

BRIEF DESCRIPTION OF THE DRAWINGS

FIG. 1 is a top view illustrating a structure of a MOSFET according to the first preferred embodiment of the present invention;

FIGS. 2A and 2B are cross-sectional views illustrating cross section structures of the MOSFET according to the first preferred embodiment of the present invention;

FIGS. 3A, 3B to 12A, 12B are cross-sectional views illustrating a method of manufacturing the MOSFET according to the first preferred embodiment of the present invention, in the order of successive steps;

DESCRIPTION OF THE PREFERRED EMBODIMENTS

First Preferred Embodiment

Figure 27:
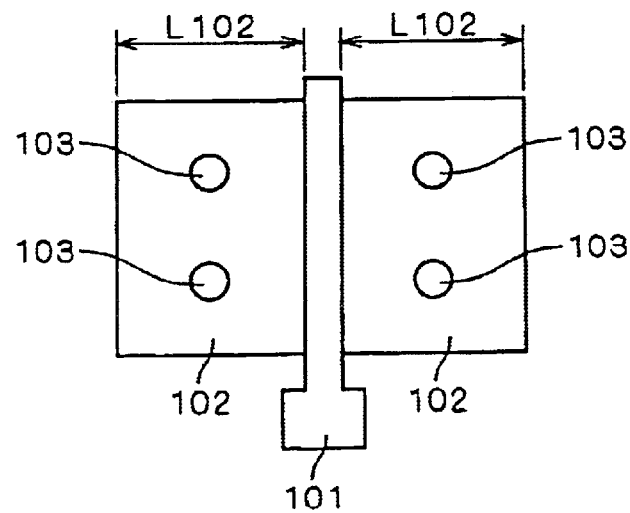
FIG. 27 is a top view illustrating a structure of a general MOSFET.

FIG. 1 is a top view illustrating a structure of a MOSFET according to the first preferred embodiment of the present invention. A channel region (not appearing in FIG. 1) is formed under a gate electrode 1, and a pair of source/drain regions 2 are formed to sandwich the channel region. The source/drain regions 2 have a first part 3a being adjacent to the channel region and a second part 3b formed to protrude in a channel width direction from the first part 3a so that a part of outer peripheries of the source/drain regions 2 extend away from the gate electrode 1 in a plan view. The MOSFET shown in FIG. 1 provides a reduced area of the source/drain regions as compared with the MOSFET shown in FIG. 27. The width L2 of the first part 3a in the channel length direction is smaller than the width L102 shown in FIG. 27, and is equal to the width L104 shown in FIG. 28. Further, contact plugs 4 are formed on the second part 3b for connecting the source/drain regions 2 to source/drain wirings (not illustrated). The contact plugs 4 have a diameter of about 0.1 to 0.3 $\mu$m. The first part 3a has a width L2 of about 0.2 to 0.5 $\mu$m, and the second part 3b has a length of about 0.1 to 0.5 $\mu$m with respect to a direction protruding from the first part 3a.

FIGS. 2A and 2B are cross-sectional views illustrating cross section structures with respect to the positions respectively along the lines A and B shown in FIG. 1. An SOI substrate 5 has a multilayered structure in which a silicon substrate 6, a BOX (buried oxide) layer 7 made of silicon oxide, and a silicon layer 8 are layered in this order. An element isolation dielectric film 9 made of silicon oxide such as STI (shallow trench isolation) is selectively formed in a top surface of the silicon layer 8.

Referring to FIG. 2A, in an element formation region of the SOI substrate 5 defined by the element isolation dielectric film 9, source/drain regions 2 are formed in a top surface of the silicon layer 8. The source/drain regions 2 have an $n^+$-type impurity diffusion region 11 formed from the top surface of the silicon layer 8 to reach the top surface of the BOX layer 7, and a silicide layer 12 formed by turning the top surface of the silicon layer 8 into silicide.

Referring to FIG. 2B, in the element formation region of the SOI substrate 5, the source/drain regions 2 forming a pair are formed in the top surface of the silicon layer 8 to sandwich a p-type body region 10 (corresponding to the aforesaid channel region). On the body region 10, a gate structure is formed having a multilayered structure in which a gate oxide film 13 and a gate electrode 1 are layered in this order. A side wall 20 made of silicon oxide is formed on the side surface of the gate structure. The gate electrode 1 has a polysilicon layer 14 formed on the gate oxide film 13 and a silicide layer 15 formed on the polysilicon layer 14.

Referring to FIGS. 2A and 2B, an interlayer dielectric film 18 made of silicon oxide is formed to cover the respective exposed surfaces of the silicide layers 15, 12, the side wall 20, and the element isolation dielectric film 9. Referring to FIG. 2A, source/drain wirings 19 made of aluminum or the like are formed on the interlayer dielectric film 18. Further, contact plugs 4 for connecting the source/drain wirings 19 to the source/drain regions 2 are selectively formed in the interlayer dielectric film 18. The contact plugs 4 each have a contact hole 16 formed from the top surface of the interlayer dielectric film 18 to reach the top surface of the silicide layer 12, and a conductor plug 17 that fills the inside of the contact hole 16.

Figure 3A:
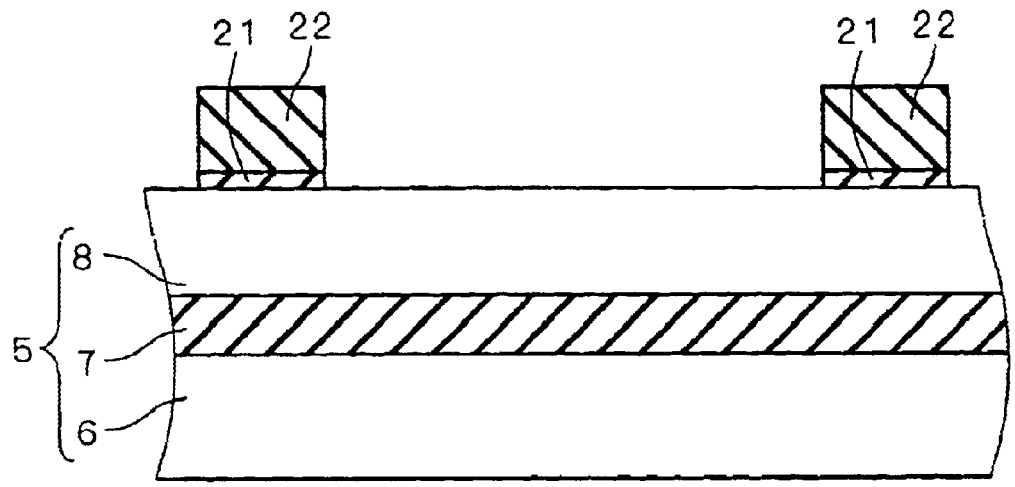
Figure 3B:
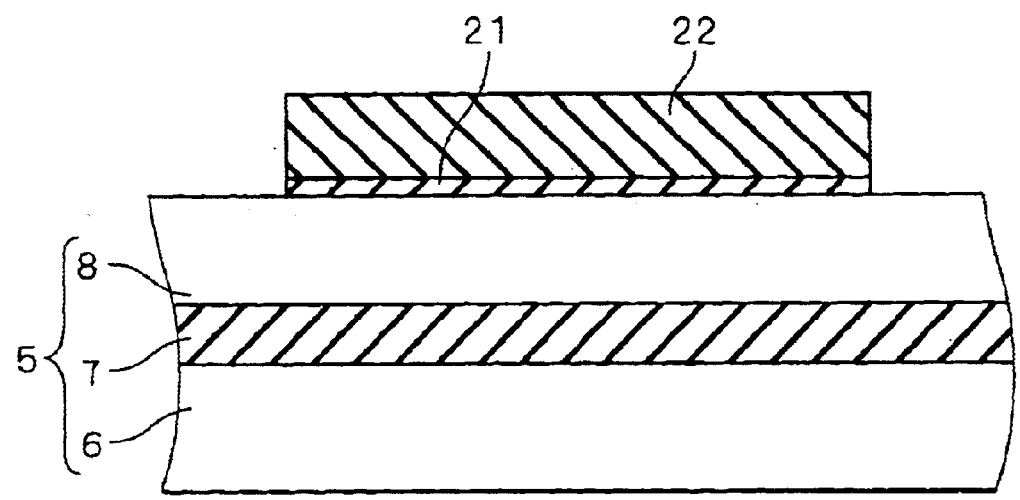
Figure 4A:
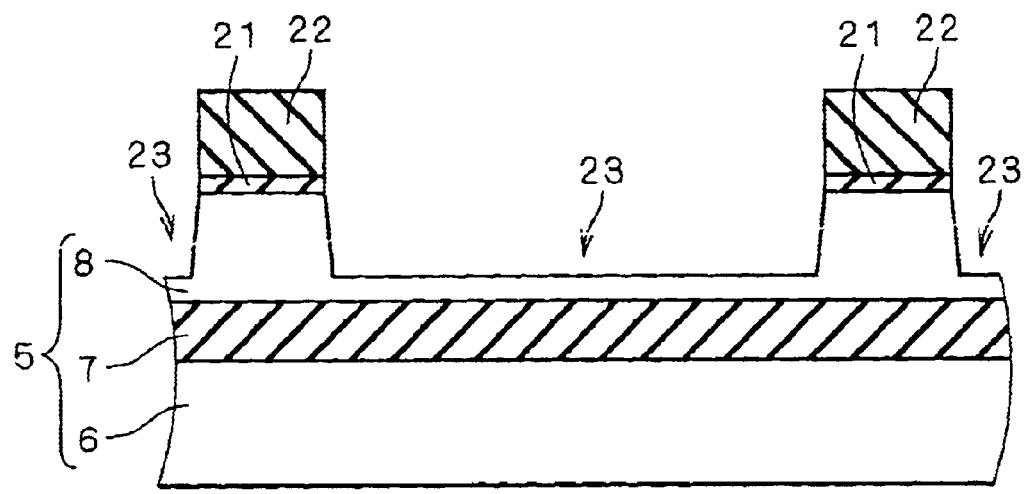

FIGS. 3A, 3B, 4A, 4B, . . . , 12A and 12B are cross-sectional views illustrating a method of manufacturing the MOSFET according to the first preferred embodiment of the present invention, in the order of successive steps. FIGS. 3A, 4A, 5A, . . . , 11A and 12A correspond to a method of manufacturing the structure shown in FIG. 2A, and FIGS. 3B, 4B, 5B, . . . , 11B and 12B correspond to a method of manufacturing the structure shown in FIG. 2B. Referring to FIGS. 3A and 3B, an SOI substrate 5 is first prepared having a multilayered structure in which a BOX layer 7 having a thickness of about 400 nm and a silicon layer 8 having a thickness of about 200 nm are formed in this order on a silicon substrate 6. Next, a silicon oxide film having a thickness of about 10 nm and a silicon nitride film having a thickness of about 200 nm are formed in this order over the entire top surface of the silicon layer 8 by the CVD method or the like. Next, these films are patterned by the photolithography method and the anisotropic dry etching method to form a multilayered structure selectively on the top surface of the silicon layer 8, in which multilayered structure a silicon oxide film 21 and a silicon nitride film 22 are layered in this order.

Figure 4B:
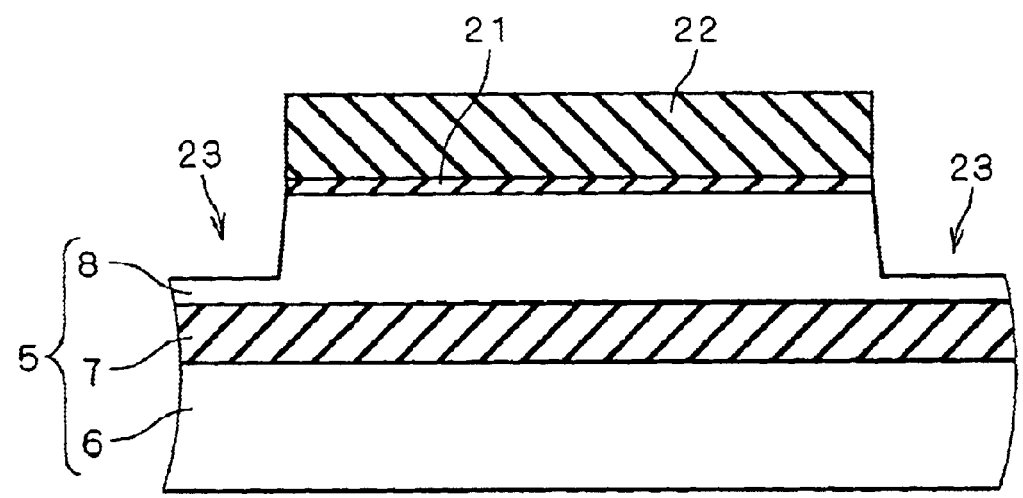
Figure 5A:
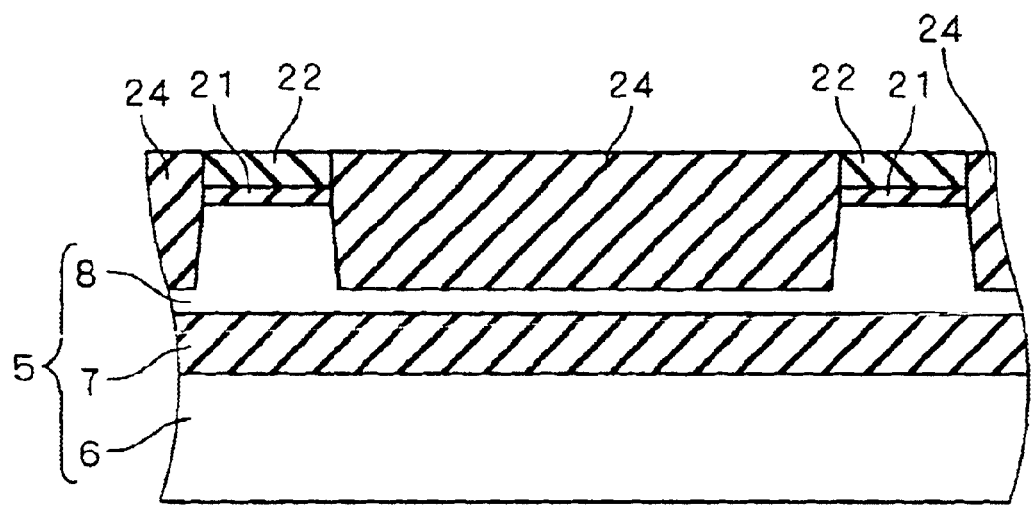

Referring to FIGS. 4A and 4B, the silicon layer 8 is etched for about 100 nm from the top surface thereof by the anisotropic dry etching method having a high etching rate in the depth direction of the SOI substrate 5 with the use of the silicon nitride film 22 as an etching mask. This forms a recessed part 23 in a part of the top surface of the silicon layer 8 where the multilayered structure made of the silicon nitride film 22 and the silicon oxide film 21 is not formed.

Figure 5B:
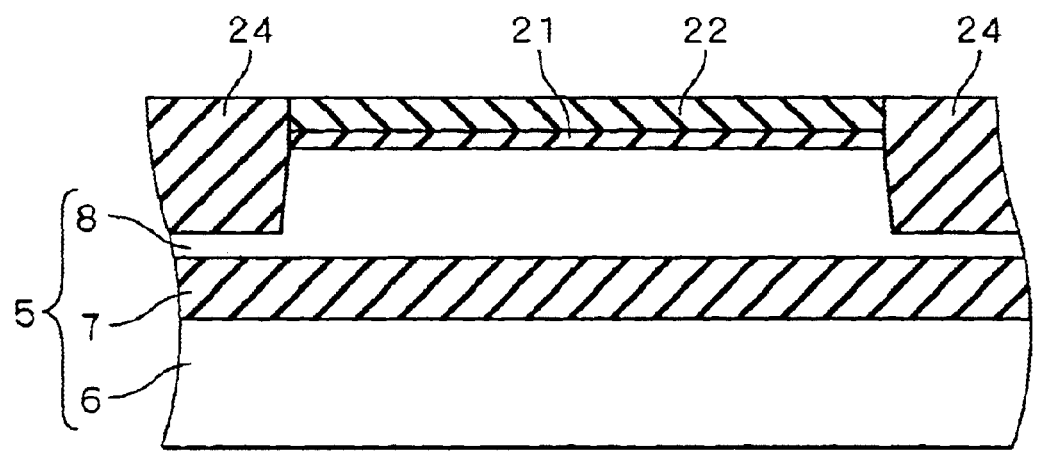

Referring to FIGS. 5A and 5B, a silicon oxide film 24 having a thickness of about 500 nm is then deposited over the entire surface by the CVD method so as to fill the inside of the recessed part 23. Next, the silicon oxide film 24 is polished and removed by the CMP (chemical mechanical polishing) method. The CMP process is terminated to leave the bottom part of the silicon nitride film 22.

Figure 6A:
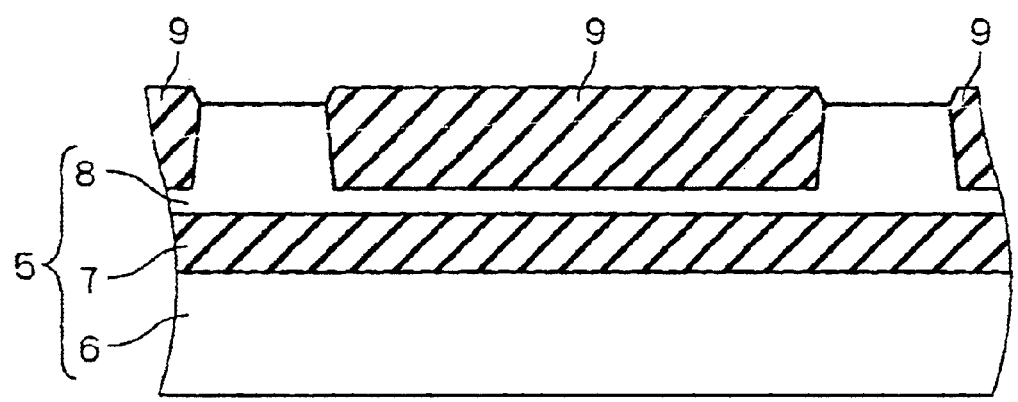
Figure 6B:
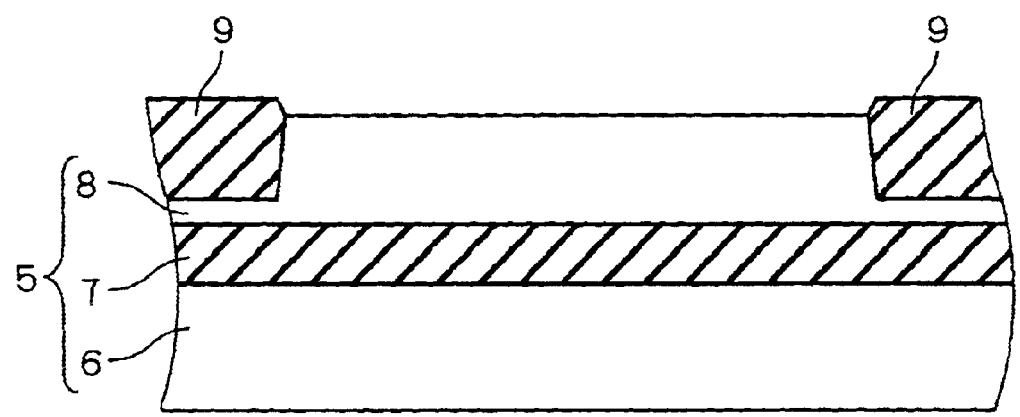

Referring to FIGS. 6A and 6B, the remaining silicon nitride film 22 is then removed by wet etching. Next, in order to form the channel region, an impurity such as boron (in the case of forming an NMOS) is introduced into the silicon layer 8 via the silicon oxide film 21 by the ion implantation method under a condition of 10 to 50 keV and 1 to 9e12 $cm^{-2}$. Here, in the case of forming a PMOS, an impurity such as arsenic may be ion-implanted under a condition of 50 to 200 keV and 1 to 9e12 $cm^{-2}$. Next, the silicon oxide film 21 is removed by wet etching. By this wet etching, the upper part of the silicon oxide film 24 is removed to some extent. By this process, an element isolation dielectric film 9 is obtained as the remaining silicon oxide film 24.

Figure 7A:
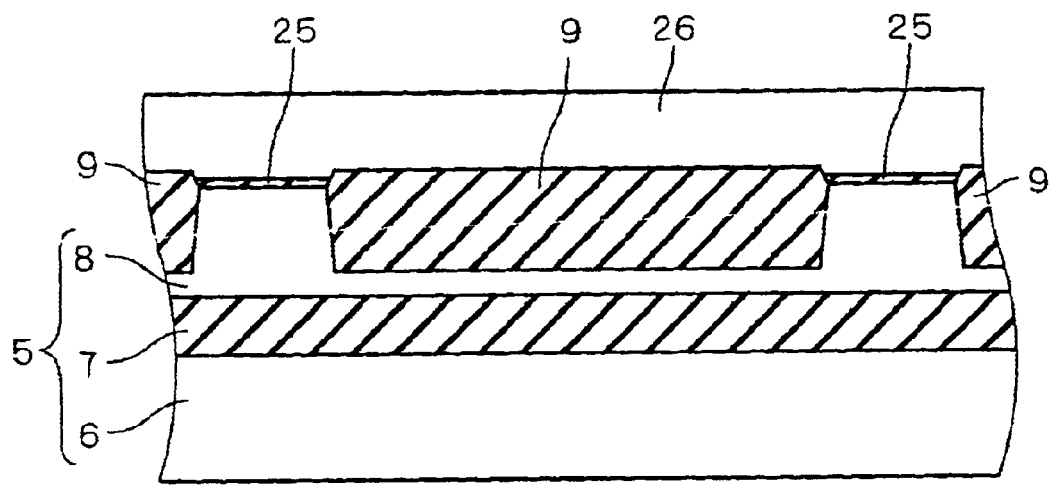
Figure 7B:
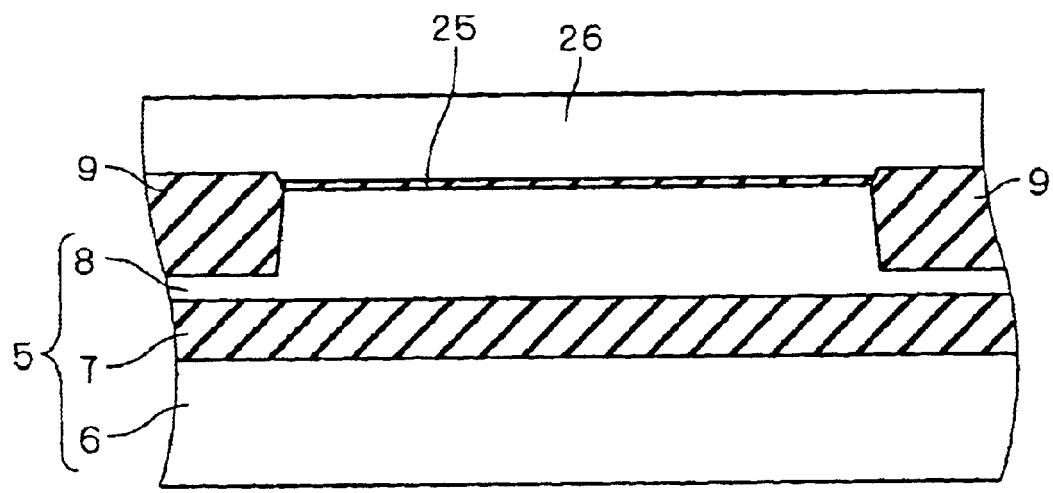

Referring to FIGS. 7A and 7B, a silicon oxide film 25 having a thickness of about 1 to 5 nm is then formed by the thermal oxidation method on the top surface of the silicon layer 8 where the element isolation dielectric film 9 is not formed. Next, a polysilicon film 26 having a thickness of about 200 nm is formed over the entire surface by the CVD method.

Figure 8A:
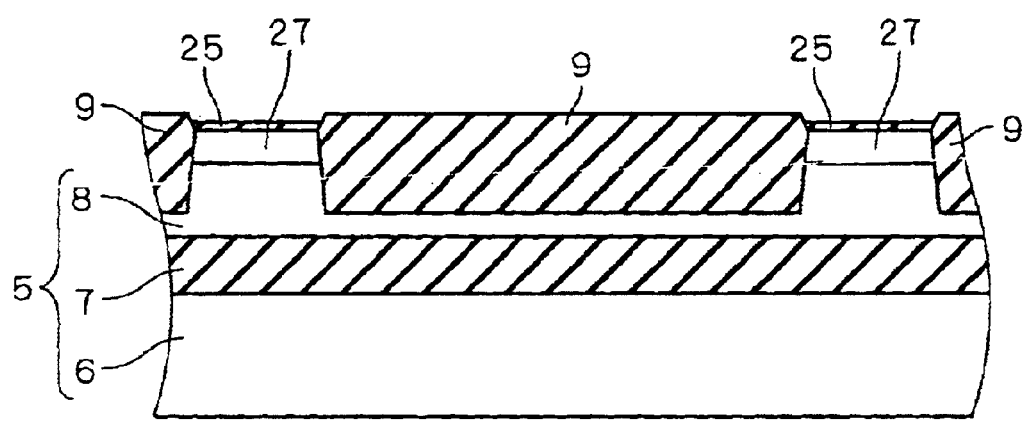
Figure 8B:
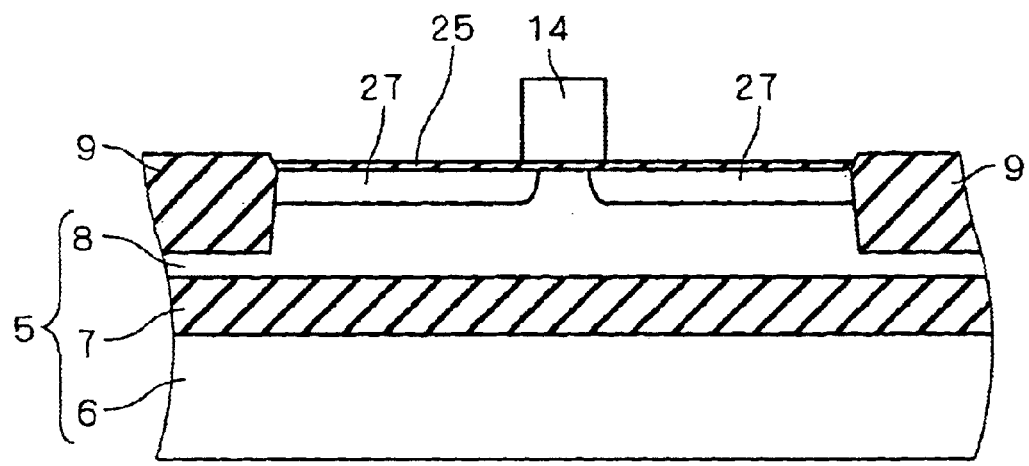

Referring to FIGS. 8A and 8B, the polysilicon film 26 is patterned by the photolithography method and the anisotropic dry etching method to form a polysilicon layer 14. Next, with the use of the polysilicon layer 14 and the element isolation dielectric film 9 as an implantation mask, an impurity such as arsenic (in the case of forming an NMOS) is introduced into the silicon layer 8 via the silicon oxide film 25 by the ion implantation method under a condition of 5 to 30 keV and 1 to 9e14 $cm^{-2}$. By this process, a low concentration region 27 having a comparatively low concentration is formed shallow in the top surface of the silicon layer 8. Here, in the case of forming a PMOS, an impurity such as $BF_2$ may be ion-implanted under a condition of 5 to 30 keV and 1 to 9e14 $cm^{-2}$.

Referring to FIGS. 9A and 9B, a silicon oxide film having a thickness of about 70 to 100 nm is then formed over the entire surface by the CVD method, and this silicon oxide film together with the silicon oxide film 25 are etched by the anisotropic dry etching method having a high etching rate in the depth direction of the SOI substrate 5, thereby to form a side wall 20 on the side surface of the polysilicon layer 14. Here, in FIG. 9B, the part of the silicon oxide film 25 which is present as an underlying layer of the side wall 20 is regarded as a part of the side wall 20, and is illustrated to be integral with the side wall 20.

Referring to FIGS. 10A and 10B, an impurity such as arsenic (in the case of forming an NMOS) is introduced into the silicon layer 8 by the ion implantation method under a condition of 10 to 80 keV and 1 to 9e15 $cm^{-2}$ using the polysilicon layer 14, the side wall 20, and the element isolation dielectric film 9 as an implantation mask. By this process, an impurity diffusion region 11 of a comparatively high concentration having a low concentration region 27 under the polysilicon layer 14 is formed. The impurity diffusion region 11 is formed from the top surface of the silicon layer 8 to reach the top surface of the BOX layer 7. Here, in the case of forming a PMOS, an impurity such as boron may be ion-implanted under a condition of 10 to 50 keV and 1 to 9e15 $cm^{-2}$.

Referring to FIGS. 11A and 11B, a metal film such as cobalt is then formed to a thickness of about 5 to 10 nm over the entire surface, followed by a heat treatment at 500 to 1000° C. for about one minute. By this process, the silicon and the metal film which are in contact with each other react, whereby a siliciding reaction occurs. By this process, the top surface of the impurity diffusion region 11 is turned into silicide to form a silicide layer 12, whereby source/drain regions 2 made of the impurity diffusion region 11 and the silicide layer 12 can be formed. Further, the top surface of the polysilicon layer 14 is turned into silicide to form a silicide layer 15, whereby a gate electrode 1 made of the polysilicon layer 14 and the silicide layer 15 can be formed. Thereafter, the part of the metal film that has not reacted with silicon is removed by wet etching.

Figure 12A:
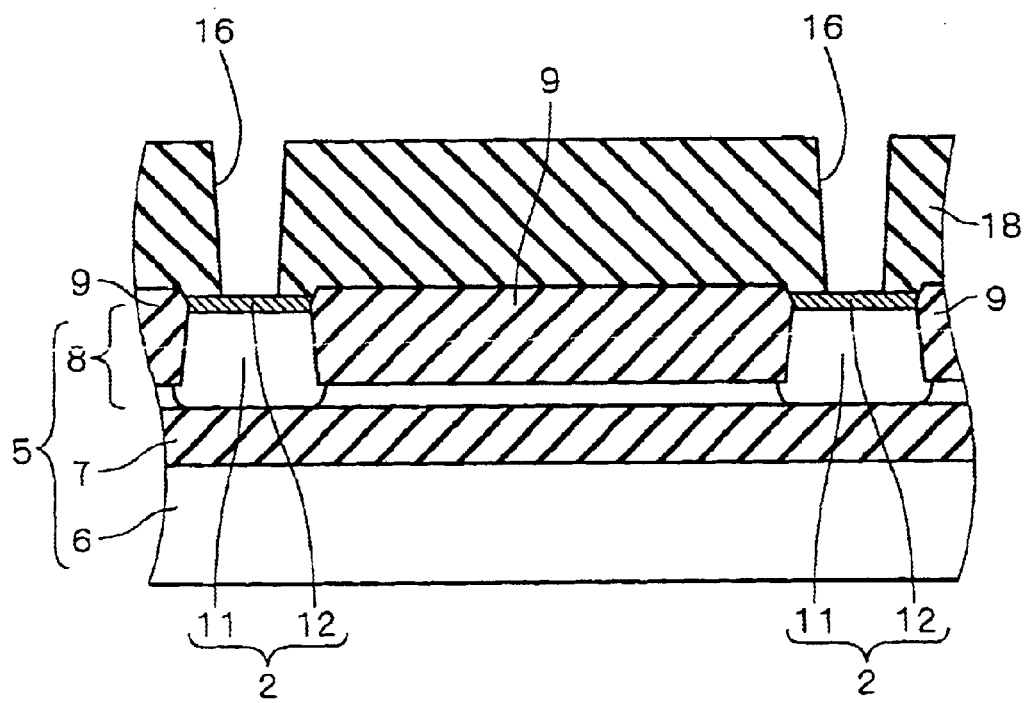
Figure 12B:
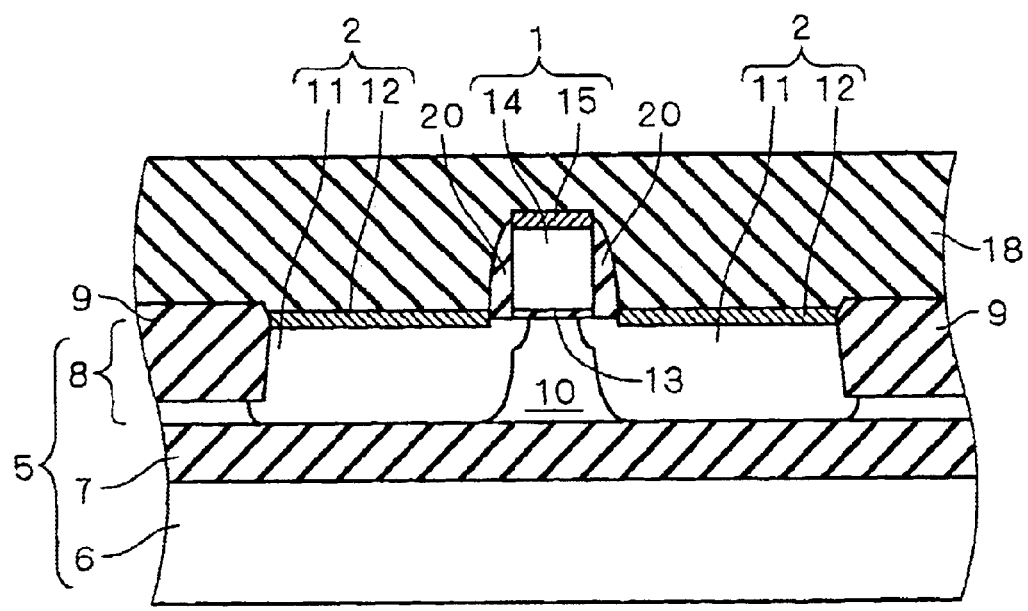

Referring to FIGS. 12A and 12B, a silicon oxide film having a thickness of about 1000 nm is then deposited over the entire surface by the CVD method, followed by polishing and removing a thickness of about 400 nm from the top surface thereof by the CMP method to planarize the top surface of the silicon oxide film. By this process, an interlayer dielectric film 18 can be formed. Contact holes 16 are then selectively formed in the interlayer dielectric film 18 from the top surface of the interlayer dielectric film 18 to reach the top surface of the silicide layer 12.

Next, after a tungsten film having a thickness of about 500 nm is deposited over the entire surface, the tungsten film is polished and removed by the CMP method until the top surface of the interlayer dielectric film 18 is exposed, thereby to fill the inside of the contact holes 16 with conductor plugs 17 (electric conductors). This completes the contact plugs 4. Next, source/drain wirings 19 made of aluminum or the like are selectively formed on the top surface of the interlayer dielectric film 18 so as to be in contact with the contact plugs 4, whereby a structure shown in FIGS. 2A and 2B is obtained.

Figure 13:
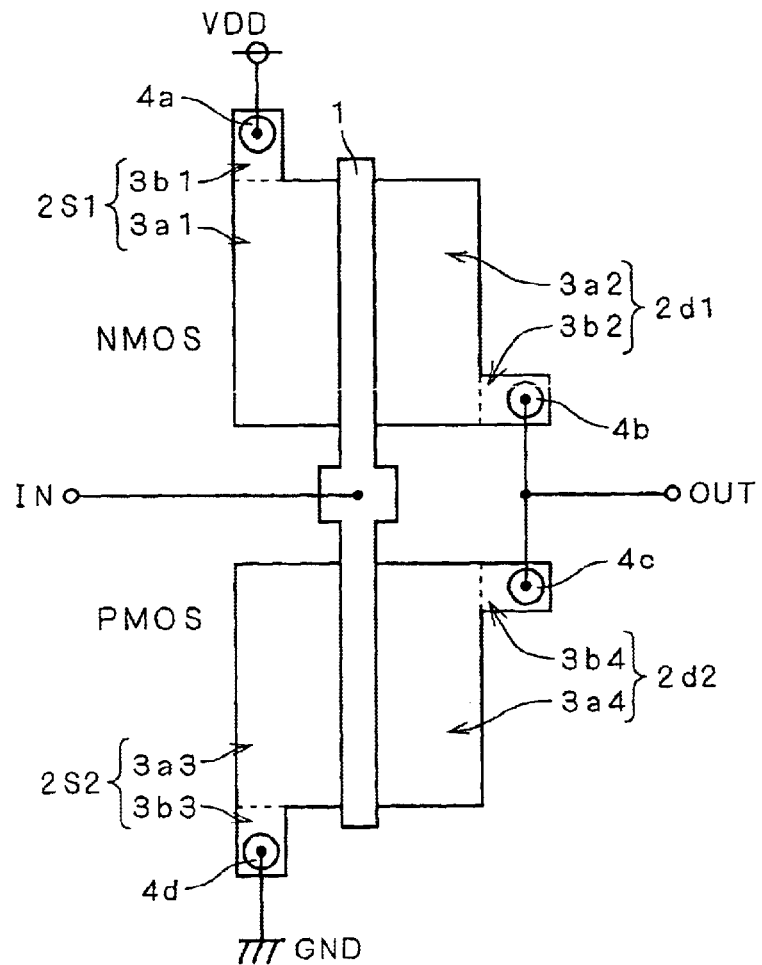
FIG. 13 is a top view illustrating an example in which the MOSFET according to the first preferred embodiment of the present invention is applied to CMOS.

FIG. 13 is a top view showing an example in which the MOSFET according to the first preferred embodiment of the present invention is applied to a CMOS. The CMOS includes an NMOS and a PMOS having a gate electrode 1 in common. The gate electrode 1 is connected to an input IN of the CMOS. The NMOS has a source region 2s1 and a drain region 2d1 forming a pair to sandwich a channel region under the gate electrode 1. The source region 2s1 has a first part 3a1 and a second part 3b1. The second part 3b1 is connected to a power supply VDD via a contact plug 4a. The drain region 2d1 has a first part 3a2 being adjacent to the channel region and a second part 3b2 formed to protrude from the first part 3a2 in the channel length direction so that a part of the outer peripheries of the drain region 2d1 extend away from the gate electrode 1 in a plan view. The second part 3b2 is connected to an output OUT of the CMOS via a contact plug 4b.

The PMOS has a source region 2s2 and a drain region 2d2 forming a pair to sandwich a channel region under the gate electrode 1. The source region 2s2 has a first part 3a3 and a second part 3b3. The second part 3b3 is connected to a ground GND via a contact plug 4d. The drain region 2d2 has a first part 3a4 being adjacent to the channel region and a second part 3b4 formed to protrude from the first part 3a4 in the channel length direction so that a part of the outer peripheries of the drain region 2d2 extend away from the gate electrode 1 in a plan view. The second part 3b4 is connected to the output OUT of the CMOS via a contact plug 4c.

Thus, according to the semiconductor device and a manufacturing method thereof in the first preferred embodiment of the present invention, the source/drain regions 2 have a first part 3a being adjacent to the body region 10 and a second part 3b formed to protrude from the first part 3a so that a part of the peripheries of the source/drain regions 2 extend away from the gate electrode 1 in a plan view. Further, contact plugs 4 for connecting the source/drain regions 2 to the source/drain wirings 19 are formed on the second part 3b of the source/drain regions 2.

Figure 28:
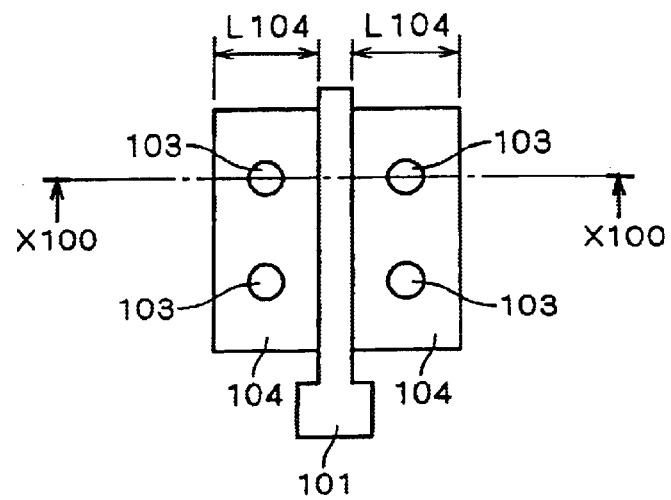
FIG. 28 is a top view illustrating a structure of a conventional MOSFET.

Therefore, the distance between the contact plugs 4 and the gate electrode 1 can be increased as compared with the conventional MOSFET shown in FIG. 28. As a result of this, the increase of the parasitic capacitance generated between the contact plugs 4 and the gate electrode 1 can be restrained while reducing the scale of the elements by reducing the area of the source/drain regions 2, thereby achieving increase of the operation speed and reduction of the electric power consumption.

Moreover, the MOSFET according to the first preferred embodiment of the present invention adopts the SOI substrate 5, and the source/drain regions 2 are formed from the top surface of the silicon layer 8 to reach the top surface of the BOX layer 7. Therefore, although the area of the source/drain regions 2 increases by the area of the formed second part 3b as compared with the conventional MOSFET shown in FIG. 28, the increase of the source/drain capacitance accompanying the increase of the area can be restrained to the minimum.

Second Preferred Embodiment

Figure 14:
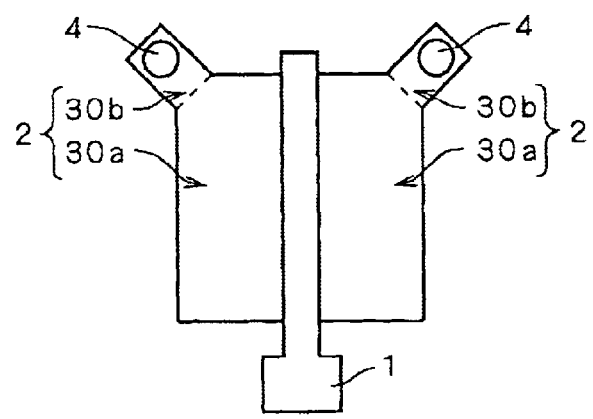
FIG. 14 is a top view illustrating a structure of a MOSFET according to the second preferred embodiment of the present invention.

FIG. 14 is a top view illustrating a structure of a MOSFET according to the second preferred embodiment of the present invention. A channel region (not appearing in FIG. 14) is formed under a gate electrode 1, and a pair of source/drain regions 2 are formed to sandwich the channel region. The source/drain regions 2 have a first part 30a being adjacent to the channel region and a second part 30b formed to protrude to the outside at an oblique angle of about 45° with respect to the channel width direction from a corner part of the first part 30a (the corner part on the side which is not adjacent to the gate electrode 1) so that a part of the peripheries of the source/drain regions 2 extend away from the gate electrode 1 in a plan view. Contact plugs 4 for connecting the source/drain regions 2 to source/drain wirings (not illustrated) are connected to the second part 30b of the source/drain regions 2. The other structures of the MOSFET according to the second preferred embodiment of the present invention are the same as the aforesaid structures of the MOSFET according to the first preferred embodiment.

Figure 15:
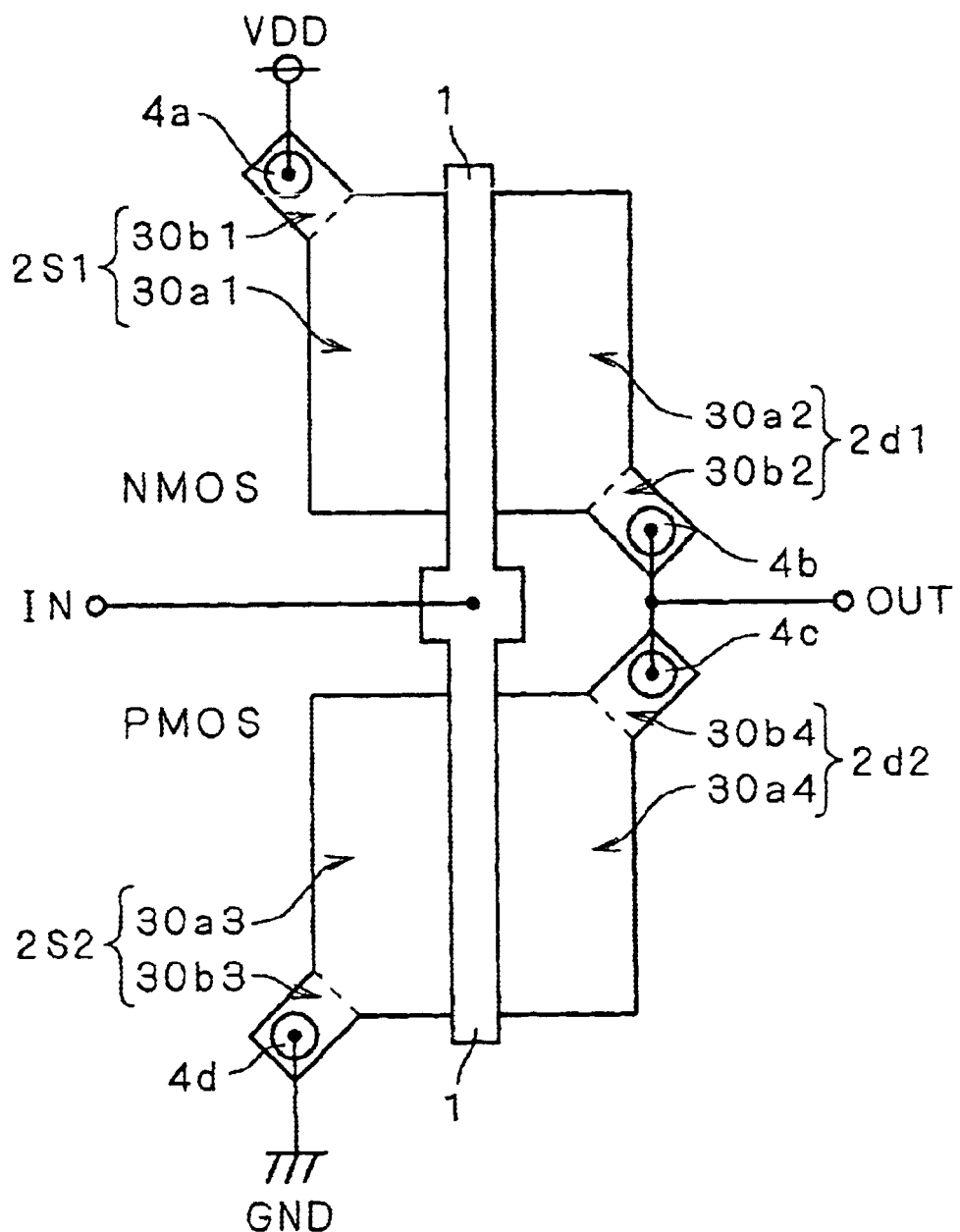
FIG. 15 is a top view illustrating an example in which the MOSFET according to the second preferred embodiment of the present invention is applied to CMOS.

FIG. 15 is a top view showing an example in which the MOSFET according to the second preferred embodiment of the present invention is applied to a CMOS. With respect to the NMOS, the source region 2s1 has a first part 30a1 and a second part 30b1. The second part 30b1 is connected to a power supply VDD via a contact plug 4a. The drain region 2d1 has a first part 30a2 and a second part 30b2. The second part 30b2 is connected to an output OUT of the CMOS via a contact plug 4b. With respect to the PMOS, the source region 2s2 has a first part 30a3 and a second part 30b3. The second part 30b3 is connected to a ground GND via a contact plug 4d. The drain region 2d2 has a first part 30a4 and a second part 30b4. The second part 30b4 is connected to an output OUT of the CMOS via a contact plug 4c.

Thus, according to the MOSFET of the second preferred embodiment, the source/drain regions 2 have a first part 30a being adjacent to the channel region and a second part 30b formed to protrude to the outside at an oblique angle of about 45° from a corner part of the first part 30a so that a part of the peripheries of the source/drain regions 2 extend away from the gate electrode 1 in a plan view. Further, the contact plugs 4 are connected to the second part 30*b* of the source/drain regions 2. Therefore, as compared with the aforesaid MOSFET according to the first preferred embodiment, the distance between the contact plugs 4 and the gate electrode 1 can be further increased, thereby further restraining the increase of the parasitic capacitance generated between the contact plugs 4 and the gate electrode 1 in accordance with the reduction of the area of the source/drain regions 2.

Third Preferred Embodiment

Figure 16:
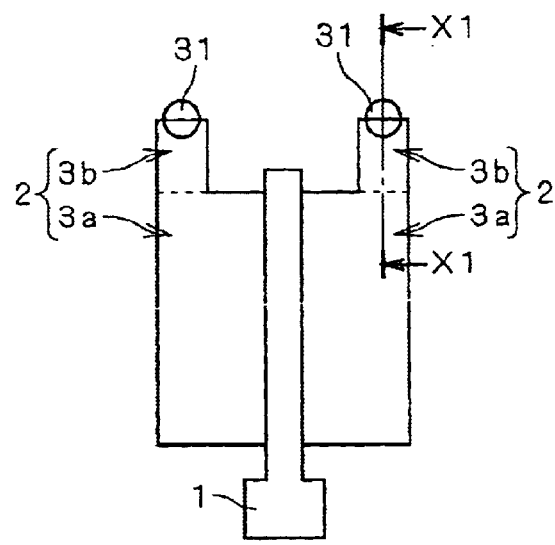
FIG. 16 is a top view illustrating a structure of a MOSFET according to the third preferred embodiment of the present invention.

FIG. 16 is a top view illustrating a structure of a MOSFET according to the third preferred embodiment of the present invention. The MOSFET according to the third preferred embodiment of the present invention is formed on the basis of the aforesaid MOSFET according to the first preferred embodiment shown in FIG. 1, and in such a manner that contact plugs 31 having a bottom surface which is partially in contact with the second part 3*b* of the source/drain regions 2 are formed to be shifted away from the gate electrode 1, instead of the contact plugs 4 having a bottom surface which is entirely in contact with the second part 3*b* of the source/drain regions 2. In FIG. 16, a lower half of the bottom surface of the contact plugs 31 is in contact with the second part 3*b*.

Figure 17:
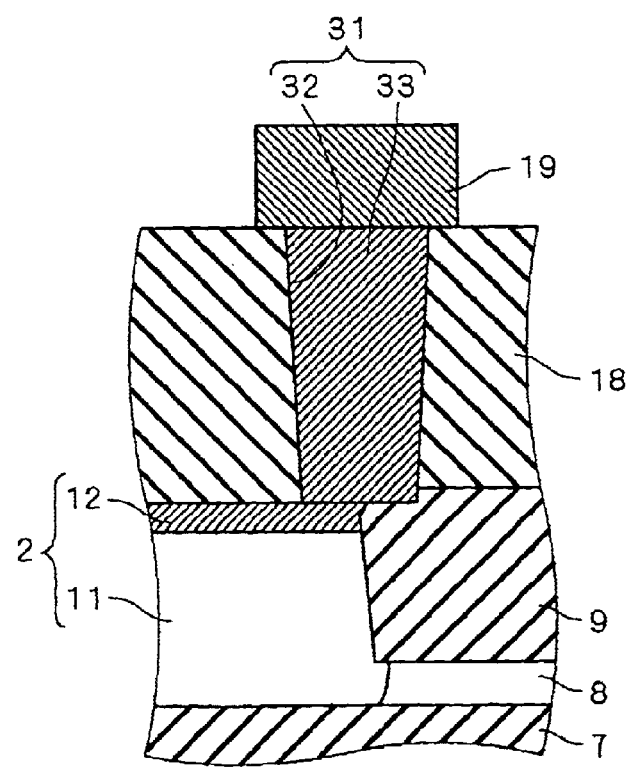
FIG. 17 is a cross-sectional view illustrating a cross section structure of the MOSFET according to the third preferred embodiment of the present invention.

FIG. 17 is a cross-sectional view illustrating a cross section structure with respect to a position along the line X1 shown in FIG. 16. The contact plug 31 has a contact hole 32 and a conductor plug 33 that fills the inside of the contact hole 32. Half of the bottom surface of the contact plug 31 on the left side closer to the first part 3*a* is in contact with the silicide layer 12, and the remaining half on the right side distant from the first part 3*a* is in contact with the element isolation dielectric film 9. Further, the top surface of the contact plug 31 is in contact with the source/drain wiring 19.

Thus, according to the MOSFET of the third preferred embodiment, the contact plug 31 is formed to have a bottom surface which is partially in contact with the second part 3*b* of the source/drain regions 2 so as to extend away from the gate electrode 1. Therefore, as compared with the aforesaid MOSFET according to the first preferred embodiment, the distance between the contact plug 31 and the gate electrode 1 can be further increased, thereby further reducing the parasitic capacitance generated between the contact plugs 31 and the gate electrode 1.

Fourth Preferred Embodiment

Figure 18:
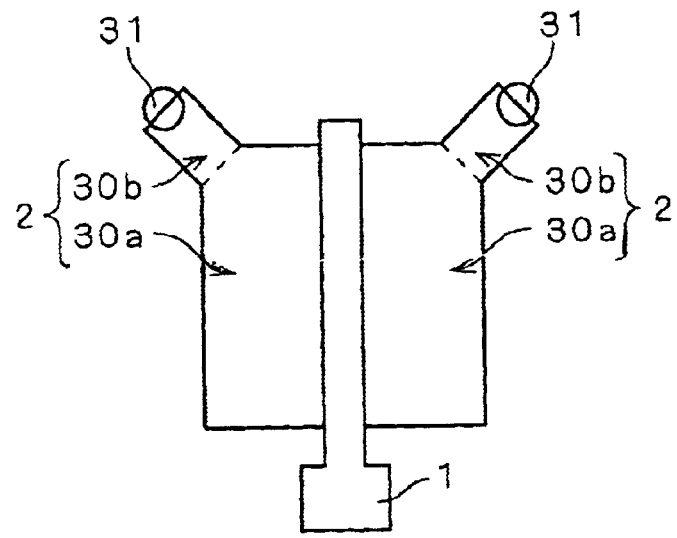
FIG. 18 is a top view illustrating a structure of a MOSFET according to the fourth preferred embodiment of the present invention.

FIG. 18 is a top view illustrating a structure of a MOSFET according to the fourth preferred embodiment of the present invention. The MOSFET according to the fourth preferred embodiment of the present invention is formed on the basis of the aforesaid MOSFET according to the second preferred embodiment shown in FIG. 14, and in such a manner that contact plugs 31 having a bottom surface which is partially in contact with the second part 30*b* of the source/drain regions 2 are formed to be shifted away from the gate electrode 1, instead of the contact plugs 4 having a bottom surface which is entirely in contact with the second part 30*b* of the source/drain regions 2.

Thus, according to the MOSFET of the fourth preferred embodiment, the contact plug 31 is formed to have a bottom surface which is partially in contact with the second part 30*b* of the source/drain regions 2 so as to extend away from the gate electrode 1. Therefore, as compared with the aforesaid MOSFET according to the second preferred embodiment, the distance between the contact plug 31 and the gate electrode 1 can be further increased, thereby further reducing the parasitic capacitance generated between the contact plugs 31 and the gate electrode 1.

Fifth Preferred Embodiment

Figure 19:
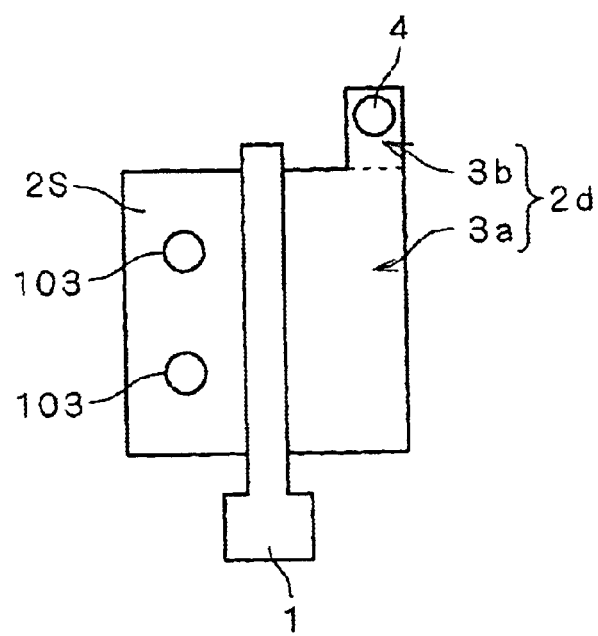
FIG. 19 is a top view illustrating a structure of a MOSFET according to the fifth preferred embodiment of the present invention.

FIG. 19 is a top view illustrating a structure of a MOSFET according to the fifth preferred embodiment of the present invention. The MOSFET according to the fifth preferred embodiment of the present invention is formed on the basis of the aforesaid MOSFET according to the first preferred embodiment shown in FIG. 1, and in such a manner that a source region 104 similar to that of the conventional MOSFET shown in FIG. 28 is formed instead of the source region 2 having the first part 3*a* and the second part 3*b*. Referring to FIG. 19, the MOSFET according to the fifth preferred embodiment has a source region 2*s* corresponding only to the first part 3*a* shown in FIG. 1. As in the conventional MOSFET shown in FIG. 28, the source region 2*s* is connected to a source wiring (not illustrated) via a contact plug 103 disposed adjacent to the gate electrode 1. The other structures of the MOSFET according to the fourth preferred embodiment are the same as the structures of the aforesaid MOSFET according to the first preferred embodiment shown in FIG. 1.

Thus, according to the MOSFET of the fifth preferred embodiment, the aforesaid invention of the first preferred embodiment is applied with respect to the drain region 2*d*, whereas the contact plug 103 is disposed at a site adjacent to the gate electrode 1 in the same manner as in the conventional MOSFET with respect to the source region 2*s*. Thus, as compared with the aforesaid MOSFET according to the first preferred embodiment, the distance between the contact plug 103 of the source region 2*s* and the gate electrode 1 can be reduced. Therefore, rise of the source resistance caused by disposal of the contact plug 4 away from the gate electrode 1 can be avoided, thereby preventing generation of the substrate bias effect accompanying the rise of the source resistance.

Here, in the above description, an example has been described in which the invention according to the fifth preferred embodiment is applied on the basis of the aforesaid MOSFET according to the first preferred embodiment. However, the invention according to the fifth preferred embodiment can be applied on the basis of the aforesaid inventions according to the second to fourth preferred embodiments.

Sixth Preferred Embodiment

Figure 20:
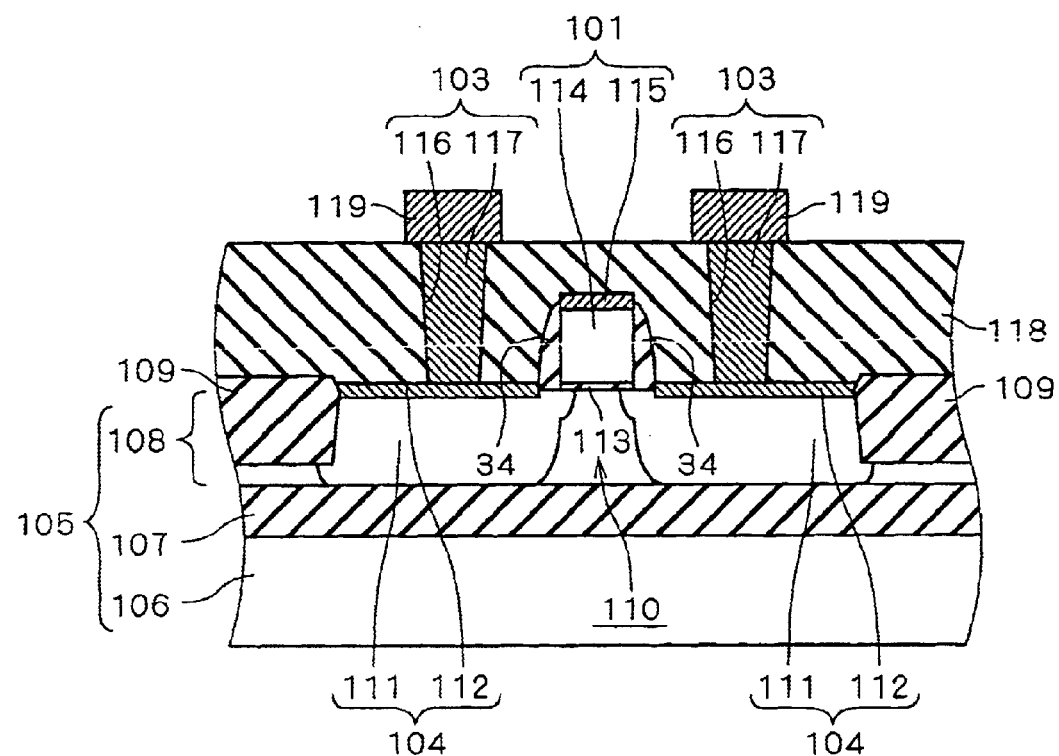
FIG. 20 is a cross-sectional view illustrating a structure of a MOSFET according to the sixth preferred embodiment of the present invention.

FIG. 20 is a cross-sectional view illustrating a structure of a MOSFET according to the sixth preferred embodiment of the present invention. An SOI substrate 105 has a multilayered structure in which a silicon substrate 106, a BOX layer 107, and a silicon layer 108 are layered in this order. An element isolation dielectric film 109 such as STI is selectively formed in the top surface of the silicon layer 108.

In the element formation region of the SOI substrate 105 defined by the element isolation dielectric film 109, source/drain regions 104 forming a pair to sandwich a p-type body region 110 are formed in the top surface of the silicon layer 108. The source/drain regions 104 have an $n^+$-type impurity diffusion region 111 formed from the top surface of the silicon layer 108 to reach the top surface of the BOX layer 107, and a silicide layer 112 formed by turning the top surface of the silicon layer 108 into silicide.

On the body region 110, a gate structure is formed having a multilayered structure in which a gate oxide film 113 and a gate electrode 101 are layered in this order. A side wall 34 made of porous silicon oxide is formed on the side surface of the gate structure. The gate electrode 101 has a polysilicon layer 114 formed on the gate oxide film 113 and a silicide layer 115 formed on the polysilicon layer 114.

Further, an interlayer dielectric film 118 made of silicon oxide is formed to cover the respective exposed surfaces of the silicide layers 115, 112, the side wall 34, and the element isolation dielectric film 109. Source/drain wirings 119 made of aluminum or the like are selectively formed on the interlayer dielectric film 118. Further, contact plugs 103 for connecting the source/drain wirings 119 to the source/drain regions 104 are selectively formed in the interlayer dielectric film 118. The contact plugs 103 each have a contact hole 116 formed from the top surface of the interlayer dielectric film 118 to reach the top surface of the silicide layer 112, and a conductor plug 117 that fills the inside of the contact hole 116.

Figure 21:
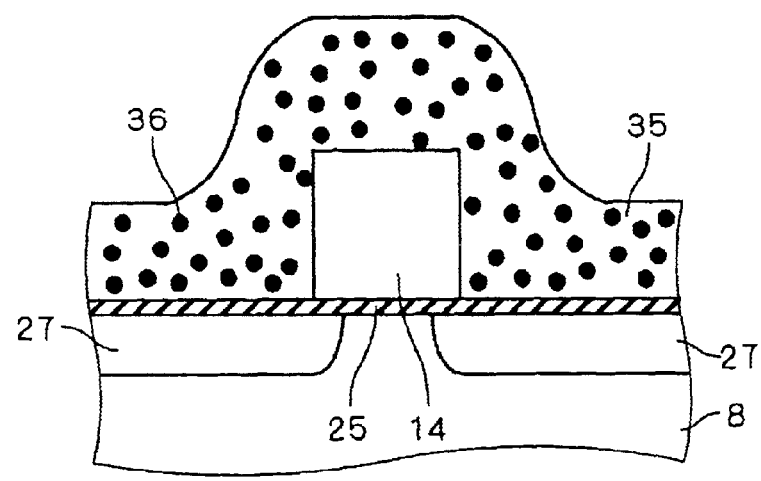
FIGS. 21 to 23 are cross-sectional views illustrating, in the order of successive steps, a method of forming a side wall with respect to the MOSFET according to the sixth preferred embodiment of the present invention.
Figure 22:
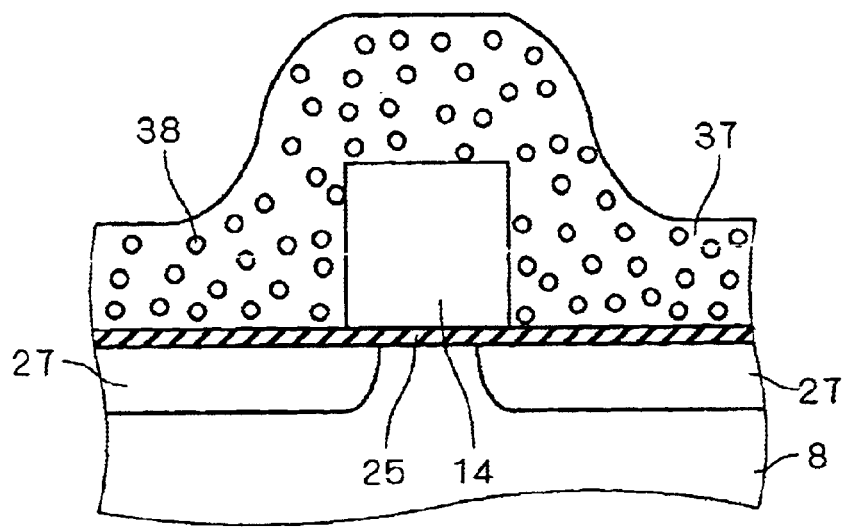
Figure 23:
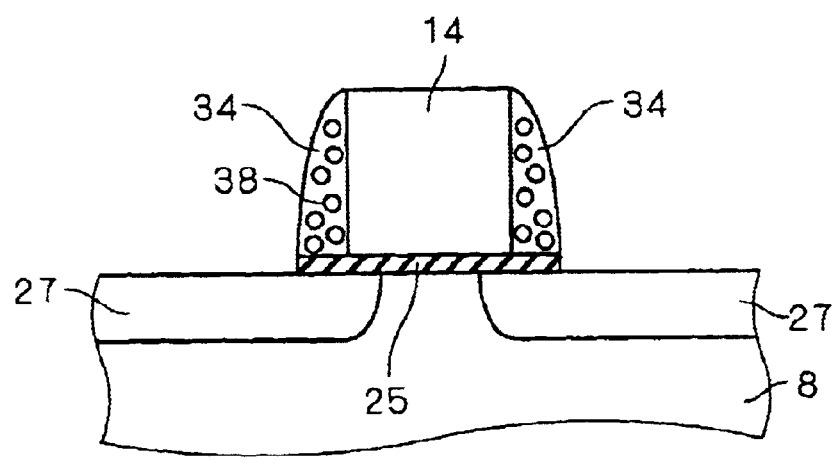

FIGS. 21 to 23 are cross-sectional views illustrating a method of forming a side wall 34 in the order of successive steps. Referring to FIG. 21, first after the structure shown in FIG. 8B is obtained in the same manner as in the aforesaid the first preferred embodiment, a silicon oxide film 35 having a thickness of about 50 nm is coated over the entire surface by spin coating. However, the silicon oxide film 35 may be formed by the CVD method. Here, extremely fine organic particles 36 (for example, particulate bodies of polyimide-based organic substance having a high boiling point) are allowed to be contained in the whole of the silicon oxide film 35.

Referring to FIG. 22, an annealing treatment is then carried out at a temperature of 500 to 900° C. for about 30 minutes to evaporate the organic particles 36 contained in the silicon oxide film 35. By this process, voids 38 are produced at the positions where the organic particles 36 were present, whereby porous silicon oxide film 37 is obtained.

Referring to FIG. 23, the silicon oxide films 37, 25 are then etched by the anisotropic dry etching method having a high etching rate in the depth direction of the SOI substrate 105, thereby to form a side wall 34 on a side surface of the polysilicon layer 14. In other words, the side wall 34 having a part of the gate dielectric film 13 as an underlying layer is formed on the side surface of the gate structure made of the gate dielectric film 13 and the polysilicon layer 14.

Thus, according to the MOSFET and the manufacturing method thereof according to the sixth preferred embodiment of the present invention, the side wall 34 made of porous silicon oxide is formed on the side surface of the gate structure. Therefore, compared with the MOSFET having a side wall made of ordinary nonporous silicon oxide, the dielectric constant of the side wall 34 decreases, whereby the parasitic capacitance generated between the contact plugs 103 of the source/drain regions 104 and the gate electrode 101 can be reduced.

Here, in the above description, an example has been described in which the MOSFET according to the sixth preferred embodiment is formed by using the SOI substrate 105. However, the same effects as described above can be produced even if the MOSFET according to the sixth preferred embodiment is formed by using an ordinary bulk substrate instead of the SOI substrate.

Seventh Preferred Embodiment

Figure 24:
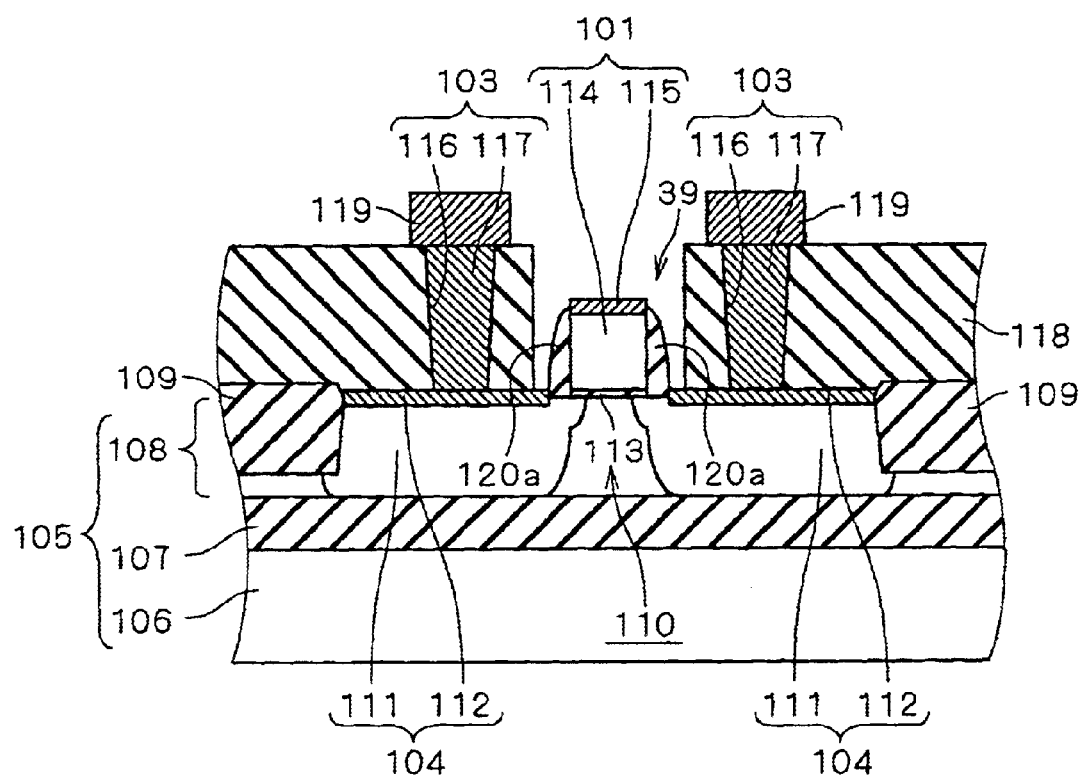
FIG. 24 is a cross-sectional view illustrating a structure of a MOSFET according to the seventh preferred embodiment of the present invention.

FIG. 24 is a cross-sectional view illustrating a structure of a MOSFET according to the seventh preferred embodiment of the present invention. Hereafter, the difference from the aforesaid MOSFET according to the sixth preferred embodiment shown in FIG. 20 will be described. A side wall 120a is formed instead of the side wall 34 made of porous silicon oxide. The side wall 120a is constructed with a material (for example, silicon nitride) which is different from the material (here, silicon oxide) of the interlayer dielectric film 118. The material constituting the side wall 120a may be either porous or non-porous.

Further, an opening 39 is formed by selectively removing the interlayer dielectric film 118 between the contact plug 103 and the gate electrode 101. As a result, the surface of the side wall 120a and the top surface of the silicide layer 115 are exposed.

Figure 25:
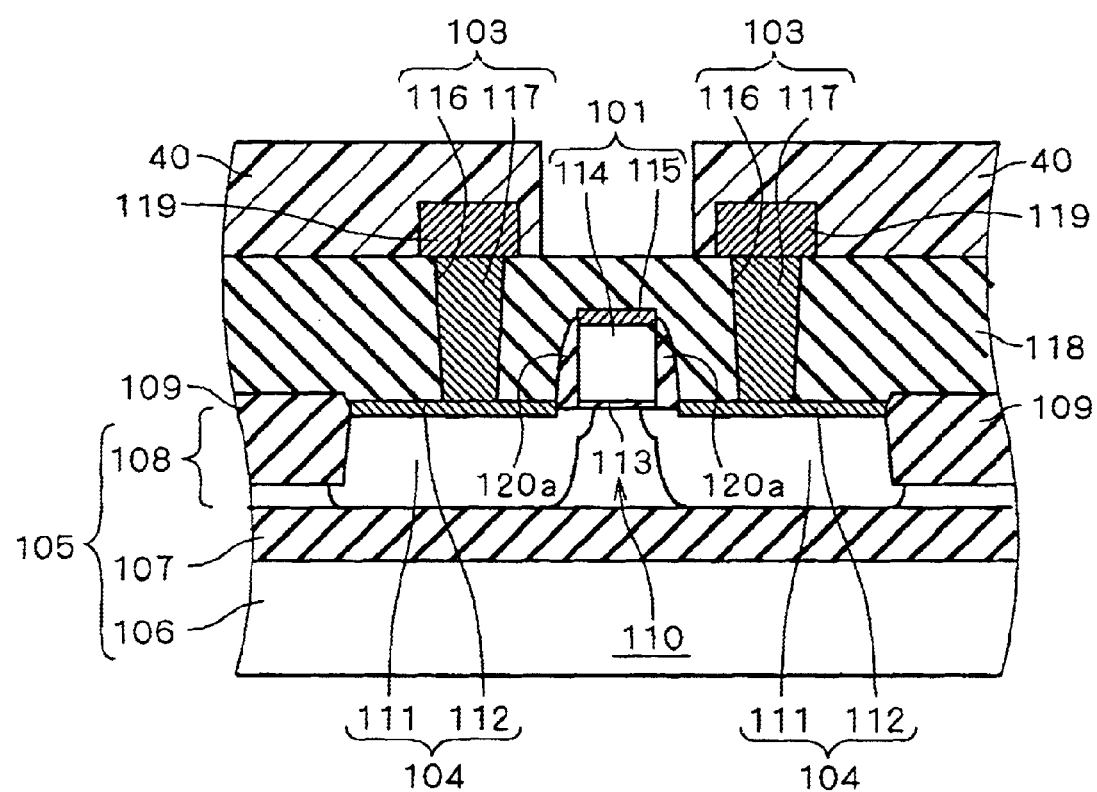
FIG. 25 is cross-sectional views illustrating a method of forming an opening with respect to the MOSFET according to the seventh preferred embodiment of the present invention.

FIG. 25 is a cross-sectional view illustrating a method of forming the opening 39. After the structure shown in FIG. 20 (however, in the seventh preferred embodiment, the side wall 120a is formed instead of the side wall 34) is obtained, a photoresist 40 is formed on the interlayer dielectric film 118 to cover the source/drain wirings 119. The photoresist 40 has a pattern such that an upper part of the region where the opening 39 is to be formed is open. Next, with the photoresist 40 used as an etching mask, the interlayer dielectric film 118 is etched by the anisotropic dry etching method having a high etching rate in the depth direction of the SOI substrate 105 and having selectivity to silicon oxide. By this process, the opening 39 is formed. Thereafter, the photoresist 40 is removed to give a structure shown in FIG. 24.

Figure 29:
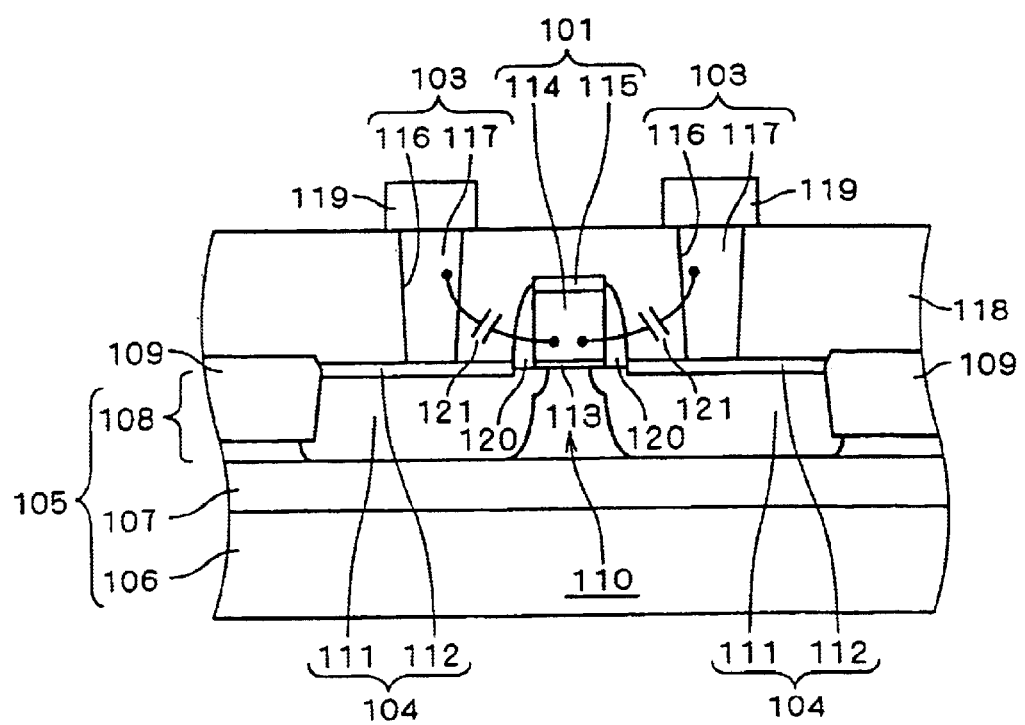
FIG. 29 is a cross-sectional view illustrating a cross section structure of the conventional MOSFET.

Thus, according to the MOSFET of the seventh preferred embodiment and the manufacturing method thereof, the opening 39 is formed by selectively removing the interlayer dielectric film 118 between the contact plug 103 of the source/drain regions 104 and the gate electrode 101. Therefore, as compared with the conventional MOSFET shown in FIG. 29, the region between the contact plug 103 and the gate electrode 101 has a lower dielectric constant, whereby the parasitic capacitance generated between the two can be reduced.

Here, in the above description, an example has been shown in which the interlayer dielectric film 118 on the gate electrode 101 is also removed. However, in order to achieve the object of reducing the parasitic capacitance generated between the contact plug 103 and the gate electrode 101, it is sufficient to remove at least the interlayer dielectric film 118 between the contact plug 103 and the gate electrode 101. Therefore, the interlayer dielectric film 118 on the gate electrode 101 need not be removed.

Here, in the above description, an example has been described in which the MOSFET according to the seventh preferred embodiment is formed by using the SOI substrate 105. However, the same effects as described above can be produced even if the MOSFET according to the seventh preferred embodiment is formed by using an ordinary bulk substrate instead of the SOI substrate.

Eighth Preferred Embodiment

Figure 26:
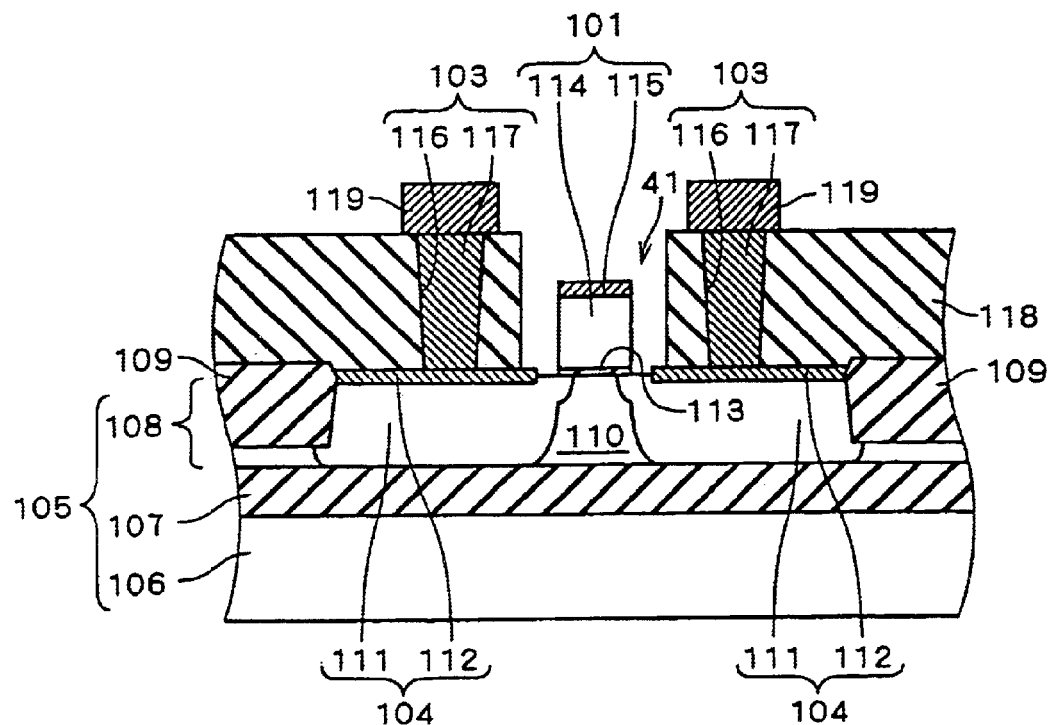
FIG. 26 is a cross-sectional view illustrating a structure of a MOSFET according to the eighth preferred embodiment of the present invention.

FIG. 26 is a cross-sectional view illustrating a structure of a MOSFET according to the eighth preferred embodiment of the present invention. Hereafter, the difference from the MOSFET according to the aforesaid seventh preferred embodiment shown in FIG. 24 will be described. The side wall 120a is removed to expose the top surface and the side surface of the gate electrode 101 in the recessed part 41. Such a structure is obtained by forming a side wall 120a with the same material (here, silicon oxide) as the interlayer dielectric film 118, and etching the side wall 120a together with the interlayer dielectric film 118 in the step shown in FIG. 25.

Thus, according to the MOSFET of the eighth preferred embodiment and the manufacturing method thereof, the side wall 120a that has been formed on the side surface of the gate electrode 101 is removed together with the interlayer dielectric film 118 between the contact plug 103 and the gate electrode 101. Therefore, as compared with the aforesaid MOSFET according to the seventh preferred embodiment, the region between the contact plug 103 and the gate electrode 101 has a further lower dielectric constant, whereby the parasitic capacitance generated between the two can be reduced.

Here, in the above description, an example has been described in which the MOSFET according to the eighth preferred embodiment is formed by using the SOI substrate 105. However, the same effects as described above can be produced even if the MOSFET according to the eighth preferred embodiment is formed by using an ordinary bulk substrate instead of the SOI substrate.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

an SOI substrate having respectively a semiconductor substrate, a dielectric layer, and a semiconductor layer;

a transistor having a drain region and a source region respectively formed in said semiconductor layer;

a gate electrode formed via a gate dielectric film on a channel region sandwiched between said drain region and said source region;

an interlayer dielectric film formed on said transistor;

a drain wiring and a source wiring formed on said interlayer dielectric film;

a first conductor formed in said interlayer dielectric film and connecting said drain wiring to said drain region;

a second conductor formed in said interlayer dielectic film and connecting said source wiring to said source region;

said drain region including, a first part adjacent to said channel region, and a second part formed to protrude from said first part of the drain region so that a part of outer peripheries of said second part of said drain region extends away from said gate electrode in a plan view; and said first conductor is connected to said second part of said drain region.

2. The semiconductor device according to claim 1, wherein said first part of said drain region has a width of 0.2 to 0.5 μm with respect to a channel length direction of said channel region, and said second part of said drain region has a length of 0.1 to 0.5 μm with respect to a direction protruding from said first part of said drain region.

3. The semiconductor device according to claim 1, wherein said first part of said drain region has a plurality of corner parts in a plan view, and said second part of said drain region is formed to protrude obliquely with respect to a channel width direction of said channel region from said corner part which is not adjacent to said gate electrode.

4. The semiconductor device according to claim 1, wherein a bottom surface of said first conductor is partially in contact with said second part of said drain region by being shifted away from said gate electrode.

5. The semiconductor device according to claim 1, wherein said source region has a first part being adjacent to said channel region, and said second conductor is connected to said first part of said source region.

6. The semiconductor device according to claim 1, wherein said transistor further has a side wall formed on a side surface of said gate electrode, and said side wall is constructed with a porous material.

7. The semiconductor device according to claim 1, wherein said interlayer dielectric film is formed except for a region between said gate electrode and said first and second conductors.

8. The semiconductor device according to claim 1, wherein said source region comprises:

a first part adjacent to said channel region;

a second part formed to protrude from said first part of the source region so that a part of outer peripheries of said second part of said source region extends away from said gate electrode in a plan view, said second conductor connected to said second part of said source region.

9. The semiconductor device according to claim 8, wherein said first part of said source region has a width of 0.2 to 0.5 μm with respect to a channel length direction of said channel region, and said second part of said source region has a length of 0.1 to 0.5 μm with respect to a direction protruding from said first part of said source region.

10. The semiconductor device according to claim 8, wherein said first part of said source region has a plurality of corner parts in a plan view, and said second part of said source region is formed to protrude obliquely with respect to a channel width direction of said channel region from said corner part which is not adjacent to said gate electrode.

11. The semiconductor device according to claim 8, wherein a bottom surface of said second conductor is partially in contact with said second part of said source region by being shifted away from said gate electrode.

* * * * *